United States Patent
Shiono et al.

(10) Patent No.: US 12,181,696 B2
(45) Date of Patent: Dec. 31, 2024

(54) OPTICAL FILTER AND IMAGING DEVICE

(71) Applicant: AGC Inc., Tokyo (JP)

(72) Inventors: Kazuhiko Shiono, Fukushima (JP); Motoshi Nakayama, Fukushima (JP); Tatsuo Yokote, Tokyo (JP); Aya Ito, Tokyo (JP)

(73) Assignee: AGC Inc., Tokyo (JP)

( * ) Notice: Subject to any disclaimer, the term of this patent is extended or adjusted under 35 U.S.C. 154(b) by 803 days.

(21) Appl. No.: 17/193,151

(22) Filed: Mar. 5, 2021

(65) Prior Publication Data

US 2021/0191012 A1 Jun. 24, 2021

Related U.S. Application Data

(63) Continuation of application No. PCT/JP2019/035779, filed on Sep. 11, 2019.

(30) Foreign Application Priority Data

Sep. 12, 2018 (JP) .................. 2018-170906

(51) Int. Cl.
*G02B 5/20* (2006.01)
*C09B 57/00* (2006.01)
(Continued)

(52) U.S. Cl.
CPC ............ *G02B 5/208* (2013.01); *C09B 57/007* (2013.01); *C09B 67/0063* (2013.01); *G02B 1/04* (2013.01); *H01L 27/1462* (2013.01)

(58) Field of Classification Search
CPC . G02B 5/208; G02B 5/20; G02B 5/22; G02B 5/26; G02B 5/28; G02B 5/281;
(Continued)

(56) References Cited

U.S. PATENT DOCUMENTS 4,260,695 A * 4/1981 Medem .................. C08G 63/19
525/461
5,543,086 A 8/1996 Bertelson et al.
(Continued)

FOREIGN PATENT DOCUMENTS

CN 106104319 A 11/2016
CN 107533171 A 1/2018
(Continued)

OTHER PUBLICATIONS

International Search Report issued Dec. 10, 2019 in PCT/JP2019/035779 filed on Sep. 11, 2019, 2 pages.

*Primary Examiner* — Stephone B Allen
*Assistant Examiner* — Adam W Booher
(74) *Attorney, Agent, or Firm* — Oblon, McClelland, Maier & Neustadt, L.L.P.

(57) ABSTRACT

An optical filter includes: a resin substrate having a thickness of 20 μm or more and 110 μm or less; an absorption layer having a thickness of 0.25 μm or more and 12 μm or less and being disposed on at least one principal surface of the resin substrate; and dielectric multilayer films disposed as an outermost layer on both principal surfaces of the resin substrate. At least one of the dielectric multilayer films is a near-infrared reflection layer. The resin substrate includes a first transparent resin having a glass transition temperature of 170° C. or more and having specific optical properties. The absorption layer includes a near-infrared absorbing dye (A) and a second transparent resin having a glass transition temperature of 170° C. or more, and the near-infrared absorbing dye (A) satisfies specific optical properties in relation to the second transparent resin.

12 Claims, 2 Drawing Sheets

(51) Int. Cl.
 *C09B 67/20* (2006.01)
 *G02B 1/04* (2006.01)
 *H01L 27/146* (2006.01)

(58) Field of Classification Search
 CPC .......... G02B 5/282; G02B 5/223; G02B 1/04; C09B 57/007; C09B 67/0063; H01L 27/1462; H01L 27/14625
 See application file for complete search history.

(56) References Cited

U.S. PATENT DOCUMENTS

| | | |
|---|---|---|
| 2014/0061505 A1 | 3/2014 | Steppel et al. |
| 2014/0264202 A1 | 9/2014 | Nagaya et al. |
| 2015/0260889 A1 | 9/2015 | Shiono et al. |
| 2015/0285971 A1* | 10/2015 | Nagaya .................. G02B 5/223 359/359 |
| 2017/0003417 A1 | 1/2017 | Nagaya et al. |
| 2017/0003425 A1 | 1/2017 | Nagaya et al. |
| 2017/0017023 A1* | 1/2017 | Sugiyama ......... H01L 27/14618 |
| 2017/0066933 A1 | 3/2017 | Shiono et al. |
| 2017/0343710 A1 | 11/2017 | Shiono et al. |
| 2018/0067243 A1 | 3/2018 | Shiono et al. |
| 2018/0259849 A1 | 9/2018 | Hirai et al. |
| 2018/0346729 A1 | 12/2018 | Miyake et al. |
| 2018/0356576 A1 | 12/2018 | Shiono et al. |
| 2019/0161629 A1 | 5/2019 | Shiono et al. |
| 2020/0408974 A1 | 12/2020 | Shiona et al. |

FOREIGN PATENT DOCUMENTS

| | | |
|---|---|---|
| JP | 2001-296423 A | 10/2001 |
| JP | 2002-372603 A | 12/2002 |
| JP | 2013-029708 A | 2/2013 |
| JP | 2013-223759 A | 10/2013 |
| JP | 5489669 B2 | 5/2014 |
| JP | 5706932 B2 | 4/2015 |
| JP | 2017-129881 A | 7/2017 |
| JP | WO2017/104283 A1 | 11/2018 |
| WO | WO 2013/146460 A1 | 10/2013 |
| WO | WO 2014/088063 A1 | 6/2014 |
| WO | WO 2014/192714 A1 | 12/2014 |
| WO | WO 2017/094858 A1 | 6/2017 |
| WO | WO 2017/135359 A1 | 8/2017 |

* cited by examiner

OPTICAL FILTER AND IMAGING DEVICE

TECHNICAL FIELD

The present invention relates to an optical filter capable of transmitting light in a visible wavelength range and cutting off light in a near-infrared wavelength range, and an imaging device including the optical filter.

BACKGROUND ART

In an imaging device using a solid-state image sensing device, an optical filter capable of transmitting light in the visible region (hereinafter, sometimes referred to as "visible light") and blocking light in the near-infrared region (hereinafter, sometimes referred to as "near-infrared light") is used so as to successfully reproduce a color tone and obtain a clear image. As the optical filter, a common near-infrared cut filter includes an absorption layer containing a near-infrared absorbing dye and a resin, and a reflection layer composed of a dielectric multilayer film for cutting off near-infrared light provided on a glass substrate.

With the recent progress toward miniaturization and weight reduction of an imaging device, a near-infrared cut filter not using a glass substrate has been required. As the near-infrared cut filter using no glass substrate, for example, Patent Literature 1 describes a near-infrared cut filter composed of a polyimide resin film containing a near-infrared absorber and a dielectric multilayer film.

Furthermore, Patent Literature 2 describes a near-infrared cut filter composed of a resin film containing a specific squarylium dye, a phthalocyanine dye and/or a cyanine dye and a dielectric multilayer film. Patent Literature 3 describes a near-infrared cut filter composed of a transparent resin film containing a near-infrared absorber, particularly, a norbornene resin film, and a dielectric multilayer film. Patent Literature 4 describes a near-infrared cut filter composed of a transparent resin film containing a near-infrared absorber and a dielectric multilayer film.

In addition, Patent Literature 5 describes a near-infrared cut filter in which an absorption layer containing a resin substrate, a near-infrared absorbing dye and a resin, and a refection layer composed of a dielectric multilayer film capable of blocking near-infrared light are provided, in which a resin selected from a fluorinated aromatic polymer, a poly(amide)imide resin, a polyamide resin, an aramid resin and a polycycloolefin resin is used for the substrate and the absorption layer.

CITATION LIST

Patent Literature

[Patent Literature 1] JP-A-2013-29708
[Patent Literature 2] JP-A-2017-129881
[Patent Literature 3] Japanese Patent No. 5489669
[Patent Literature 4] International Publication WO2014/192714
[Patent Literature 5] Japanese Patent No. 5706932

SUMMARY OF INVENTION

Technical Problem

In the infrared absorption filter composed of a polyimide film of Patent Literature 1, the transmittance in a blue wavelength band decreases due to absorption by the film itself. Addition of a dye into a polyimide film having a thickness of 20 μm or more requires high-temperature drying so as to volatilize a high-boiling-point solvent such as γ-butyrolactone or N-methylpyrrolidone used in the polyimide varnish, and the dye that can be used is limited to a dye (for example, a phthalocyanine-based dye) not undergoing thermal deterioration at the temperature during drying, which makes it difficult to provide an optical film having excellent visible light transmittance.

In Patent Literature 2, a cycloolefin polymer, a polycarbonate, a polyethersulfone, an acrylic resin, etc. are exemplified as the film substrate. In view of the transparency and the glass transition temperature, the resin that is specifically exemplified can hardly be said to sufficiently satisfy both. A low glass transition temperature leads to an increase in the possibility that curling or cracking of a multilayer film deposited on the film is caused due to expansion or contraction of the film in the heating process.

In Patent Literatures 3, 4 and 5, the visible light transmittance is excellent as well, but those capable of satisfying both the visible light transmittance and the glass transition temperature have not been reported.

In related arts, deformation of the film due to a high-temperature process or thermal deterioration of a dye during processing is likely to occur, and furthermore, even if a configuration capable of withstanding a high-temperature process is established, a configuration satisfying the visible light transmittance at the same time has not been reported.

In this way, all of the near-infrared cut filters of Patent Literatures 1 to 5 have achieved reduction in thickness but have not succeeded in satisfying high transparency to visible light, high shielding property for near-infrared light, and heat resistance of these optical properties at the same time.

An object of the present invention is to provide an optical filter having, in a near-infrared cut filter using a resin material as a substrate, high transparency to visible light and high shielding property for near-infrared light and having excellent heat resistance of these optical properties, and an imaging device using the optical filter and being excellent in the color reproducibility and heat resistance.

Solution to Problem

An optical filter according to one embodiment of the present invention includes:

a resin substrate having a thickness of 20 μm or more and 110 μm or less;

an absorption layer having a thickness of 0.25 μm or more and 12 μm or less and being disposed on at least one principal surface of the resin substrate; and dielectric multilayer films disposed as an outermost layer on both principal surfaces of the resin substrate, in which:

at least one of the dielectric multilayer films is a near-infrared reflection layer;

the resin substrate includes, as a main component, a first transparent resin having a glass transition temperature of 170° C. or more, the first transparent resin having, when a thickness thereof is 100 μm, in a spectral transmittance curve over a wavelength range of 350 nm to 1,100 nm, an average internal transmittance in a wavelength range of 350 nm to 450 nm being 95% or more, a minimum internal transmittance in a wavelength range of 400 nm to 450 nm being 97% or more, and a wavelength at which an internal transmittance becomes 90% in a wavelength range of 500 nm or less being 350 nm or less; and the absorption layer includes a near-infrared absorbing dye (A) and a second transparent resin having a glass transition temperature of 170° C. or more, and the near-infrared absorbing dye (A) satisfies the following (ii-1) and (ii-2) in relation to the second transparent resin:

(ii-1) in a spectral transmittance curve over a wavelength range of 400 nm to 800 nm as measured in a state of the near-infrared absorbing dye (A) being contained in the second transparent resin, a maximum absorption wavelength $\lambda_{max(A)TR}$ is within a wavelength range of 680 nm to 745 nm; and (ii-2) in a spectral transmittance curve over a wavelength range of 350 nm to 1,100 nm when the near-infrared dye (A) is incorporated into the second transparent resin and the internal transmittance at the maximum absorption wavelength $\lambda_{max(A)TR}$ is adjusted to 1%, both an average internal transmittance $T_{435-500ave(A)TR}$ for light in a wavelength range of 435 nm to 500 nm and an average internal transmittance $T_{500-600ave(A)TR}$ for light in a wavelength range of 500 nm to 600 nm are 94% or more.

In addition, the present invention provides an imaging device including the optical filter in the present invention.

Advantageous Effects of Invention

In the present invention, an optical filter having, in a near-infrared cut filter using a resin material as a substrate, high transparency to visible light and high shielding property for near-infrared light and having excellent heat resistance of these optical properties, particularly, having resistance to thermal deformation in a high-temperature process and furthermore, to thermal deterioration of a dye, is obtained. In addition, in the present invention, an imaging device using the optical filter and having not only excellent color reproducibility but also excellent heat resistance of the color reproducibility can be provided.

Furthermore, a near-infrared cut filter using a resin material without a use of a glass substrate sometimes involves a problem that the substrate is likely to receive a stress from a dielectric multilayer film and the dielectric multilayer film is readily separated from the substrate or absorption layer using a resin material. In a preferred embodiment of the optical filter of the present invention, in addition to the effects above, the dielectric multilayer film has high adhesiveness to the substrate or absorption layer using a resin material. Consequently, also in the imaging device, in addition to the effects above, separation of the dielectric multilayer film is inhibited and in turn, an imaging device having excellent durability is obtained.

DESCRIPTION OF EMBODIMENTS

Figure 1:
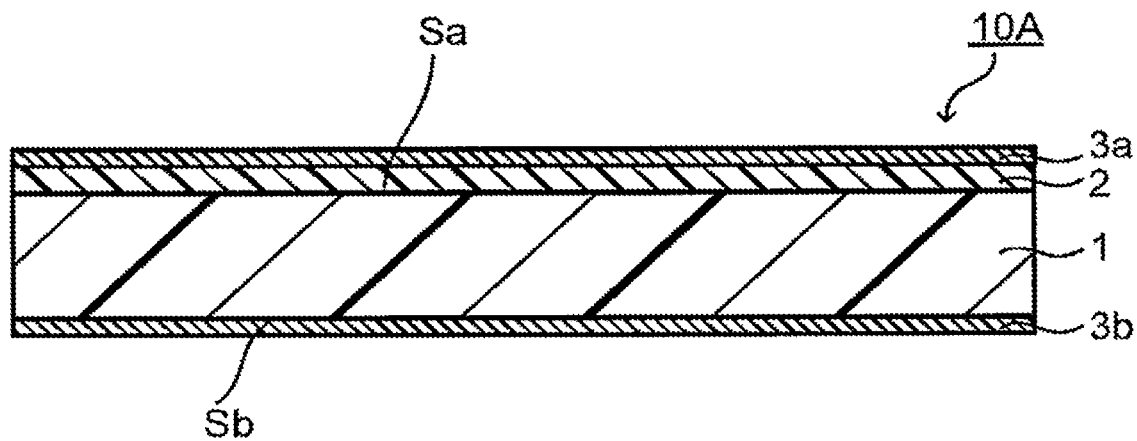
FIG. 1 is a cross-sectional diagram schematically illustrating an example of the optical filter according to one embodiment.

The embodiments of the present invention are described below.

In the present description, a near-infrared absorbing dye and an ultraviolet absorbing dye are sometimes simply referred to as "NIR dye" and "UV dye", respectively.

In the present description, a compound represented by formula (I) is referred to as a compound (I), and the same holds true for compounds represented by other formulae. Also, a dye including a compound (I) is sometimes referred to as a dye (I), and the same holds true for other dyes. For example, a compound represented by the later-described formula (A1) is referred to as a compound (A1), and a dye including the compound is sometimes referred to as a dye (A1). In addition, for example, a group represented by formula (1x) is sometimes referred to as a group (1x), and the same holds true for groups represented by other formulae.

In the present description, the internal transmittance is a transmittance obtained by subtracting an effect of interface reflection from a measured transmittance and represented by the formula: measured transmittance/(100–reflectance). In the present description, the spectra of transmittance of the resin substrate and transmittance of a layer as measured in a state of a dye being contained in the transparent resin, such as absorption layer, all are "internal transmittance" even when it is referred to as "transmittance". On the other hand, a transmittance as measured in a state of a dye being dissolved in a solvent such as dichloromethane and a transmittance of an optical filter having a dielectric multilayer film are a measured transmittance.

In the present description, with respect to a specific wavelength region, in the case where the transmittance is, for example, 90% or more, this means that the transmittance does not fall below 90% in the entire wavelength range, i.e., the minimum transmittance is 90% or more in the wavelength range. Similarly, with respect to a specific wavelength region, when the transmittance is, for example, 1% or less, this means that the transmittance does not exceed 1% in the entire wavelength range, i.e., the maximum transmittance is 1% or less in the wavelength range. The same holds true for the internal transmittance. The average transmittance and average internal transmittance in a specific wavelength region are respective arithmetic averages of transmittances and internal transmittances measured every 1 nm in the wavelength region.

In the present description, a numerical value range expressed using "to" includes upper and lower limits.

<Optical Filter>

The optical filter according to one embodiment of the present invention (hereinafter, sometimes referred to as "the present filter") includes a resin substrate having the following configuration, an absorption layer having the following configurations and being disposed on at least one principal surface of the resin substrate, and dielectric multilayer films disposed as an outermost layer on both principal surfaces of the resin substrate, in which at least one of the dielectric multilayer films is a near-infrared reflection layer.

The resin substrate in the present filer has a thickness of 20 μm or more and 110 μm or less and contains, as a main component, a first transparent resin having a glass transition temperature of 170° C. or more. The first transparent resin has, when the thickness thereof is 100 μm, in a spectral transmittance curve over a wavelength range of 350 nm to 1,100 nm, the average internal transmittance in a wavelength range of 350 nm to 450 nm being 95% or more, the minimum internal transmittance in a wavelength range of 400 nm to 450 nm being 97% or more, and the wavelength at which the internal transmittance becomes 90% in a wavelength range of 500 nm or less being 350 nm or less.

The absorption layer in the present filter has a thickness of 0.25 μm or more and 12 μm or less and contains an NIR dye (A) and a second transparent resin having a glass transition temperature of 170° C. or more. In the absorption layer of the present filter, the relationship between the NIR dye (A) and the second transparent resin satisfies the following (ii-1) and (ii-2).

(ii-1) In a spectral transmittance curve over a wavelength range of 400 nm to 800 nm as measured in a state of the NIR dye (A) being contained in the second transparent resin, the maximum absorption wavelength $\lambda_{max(A)TR}$ is present in a wavelength range of 680 nm to 745 nm.

(ii-2) In a spectral transmittance curve over a wavelength range of 350 nm to 1,100 nm when the NIR dye (A) is incorporated into the second transparent resin and the internal transmittance at the maximum absorption wavelength $\lambda_{max(A)TR}$ is adjusted to 1%, both an average internal transmittance $T_{435-500ave(A)TR}$ for light in a wavelength range of 435 nm to 500 nm and an average internal transmittance $T_{500-600ave(A)TR}$ for light in a wavelength range of 500 nm to 600 nm are 94% or more.

The NIR dye (A) preferably satisfies the following (i-1) and (i-2).

(i-1) In a spectral transmittance curve over a wavelength range of 400 nm to 800 nm as measured in a state of the NIR dye (A) being dissolved in dichloromethane, the maximum absorption wavelength $\lambda_{max(A)DCM}$ is in a wavelength range of 670 nm to 735 nm.

(i-2) In a spectral transmittance curve over a wavelength range of 350 nm to 1,100 nm as measured in a state of the NIR dye (A) being incorporated into dichloromethane such that the transmittance at the maximum absorption wavelength $\lambda_{max(A)DCM}$ becomes 1%, the average transmittance in a wavelength range of 435 nm to 500 nm (hereinafter, referred to as "$T_{435-500ave(A)DCM}$" is 94% or more and the average transmittance in a wavelength range of 500 nm to 600 nm (hereinafter, referred to as "$T_{800-600ave(A)DCM}$") is 94% or more.

Figure 2:
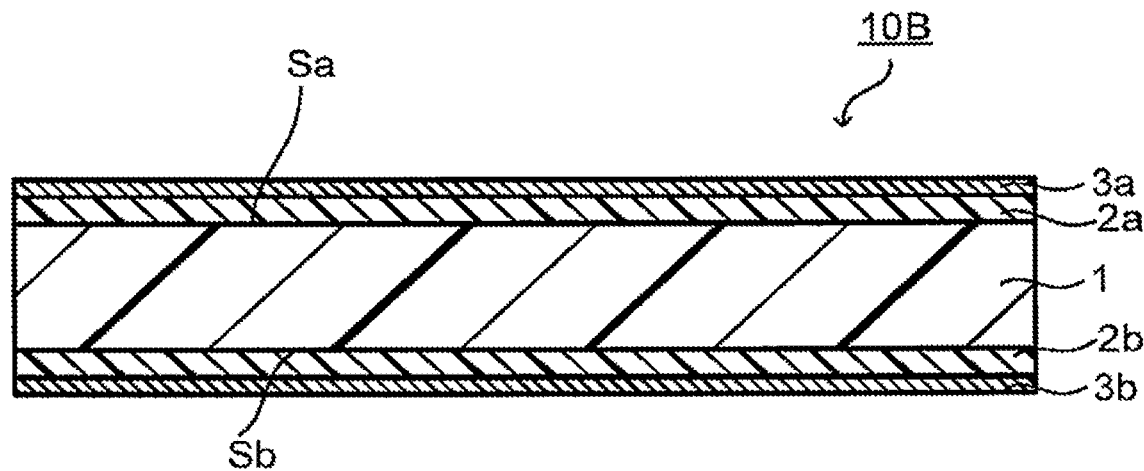
FIG. 2 is a cross-sectional diagram schematically illustrating another example of the optical filter according to one embodiment.

Configuration examples of the present filter are described using the drawings. FIG. 1 and FIG. 2 are cross-sectional diagrams schematically illustrating an example and another example of the optical filter according to one embodiment. The present filter may have an absorption layer on one principal surface of the resin substrate or on both principal surfaces. The optical filter 10A illustrated in FIG. 1 is an example including an absorption layer 2 on one principal surface Sa of the resin substrate 1, and the optical filter 10B illustrated in FIG. 2 is an example including absorption layers on both principal surfaces, i.e., including a first absorption layer 2a and a second absorption layer 2b respectively on a principal surface Sa and a principal surface Sb of the resin substrate 1. Here, the expression "include an absorption layer 2 on or above one principal surface Sa of the resin substrate 1" is not limited to a case where an absorption layer 2 is provided in contact with a principal surface Sa of the resin substrate 1 but also encompasses a case where another functional layer is provided between the resin substrate 1 and the absorption layer 2. In other configurations as well, the expression "include on or above a principal surface" has the same meaning.

The optical filter 10A illustrated in FIG. 1 includes a resin substrate 1 having first principal surface Sa and second principal surface Sb which face each other, an absorption layer 2 disposed on the first principal surface Sa of the resin substrate 1, a first dielectric multilayer film 3a disposed as an outermost layer on the absorption layer 2 on the first principal surface Sa of the resin substrate 1, and a second dielectric multilayer film 3b disposed as an outermost layer on the second principal surface Sb of the resin substrate 1.

In the optical filter 10A, the resin substrate 1 has the above-described configuration. The absorption layer 2 is a near-infrared absorption layer having the above-described thickness and containing an NIR dye (A) and a second transparent resin. The absorption layer 2 may contain, other than the NIR dye (A), a dye capable of absorbing light in a wavelength range except for near-infrared rays, for example, a UV dye.

In the optical filter 10A, as long as at least one of the first dielectric multilayer film 3a and the second dielectric multilayer film 3b is a near-infrared reflection layer, the other may or may not be a near-infrared reflection layer. Examples of the dielectric multilayer film other than the near-infrared reflection layer include an antireflection layer and a reflection layer reflecting light in a wavelength range except for near-infrared rays. The near-infrared reflection layer may reflect light in a wavelength region other than near-infrared light.

The first dielectric multilayer film 3a and the second dielectric multilayer film 3b may be the same or different. For example, these films may be formed in a configuration where both the first dielectric multilayer film 3a and the second dielectric multilayer film 3b are a near-infrared reflection layer having properties of reflecting near-ultraviolet light and near-infrared light and transmitting visible light, the first dielectric multilayer film 3a reflects near-ultraviolet light and light in a first near-infrared region, and the second dielectric multilayer film 3b reflects near-ultraviolet light and light in a second near-infrared region.

The optical filter 10B illustrated in FIG. 2 includes a resin substrate 1 having first principal surface Sa and second principal surface Sb which face each other, a first absorption layer 2a disposed on the first principal surface Sa of the resin substrate 1, a second absorption layer 2b disposed on the second principal surface Sb of the resin substrate 1, a first dielectric multilayer film 3a disposed as an outermost layer on the absorption layer 2a on the first principal surface Sa of the resin substrate 1, and a second dielectric multilayer film 3b disposed as an outermost layer on the second absorption layer 2b on the second principal surface Sb of the resin substrate 1.

In the optical filter 10B, the resin substrate 1 has the above-described configuration. The first dielectric multilayer film 3a and the second dielectric multilayer film 3b may be formed in the same configuration as that in the optical filter 10A. In the optical filter 10B, at least one of the first absorption layer 2a and the second absorption layer 2b is an absorption layer having the above-described configuration in the present filter. As with the absorption layer 2 of the optical filter 10A, the absorption layer having the configuration above in the present filter may contain, other than the NIR dye (A), a dye capable of absorbing light in a wavelength range except for near-infrared rays, for example, a UV dye. The first absorption layer 2a and the second absorption layer 2b may be the same or different.

In the case where the first absorption layer 2a and the second absorption layer 2b are different, these layers may be, for example, a combination where the first absorption layer 2a and the second absorption layer 2b are respectively a near-infrared absorption layer having the above-described configuration in the present filter and an ultraviolet absorption layer containing a transparent resin and a UV dye.

The resin substrate, the absorption layer, and the dielectric multilayer film containing a near-infrared reflection layer, which constitutes the present filter, are described below. In the following description, unless otherwise indicated, an absorption layer having the thickness above and containing an NIR dye (A) and a second transparent resin is simply referred to as "absorption layer". An absorption layer not satisfying these requirements is referred to as "another absorption layer".

[Resin Substrate]

The resin substrate has a thickness of 20 µm or more and 110 µm or less and contains, as a main component, a first transparent resin having a glass transition temperature (hereinafter, sometimes referred to as "Tg") of 170° C. or more. Tg is determined by DSC measurement (Differential Scanning calorimetry). The resin substrate contains a first transparent resin as a main component, and this means that the percentage of the first transparent resin in the resin substrate is 90 mass % or more. In view of Tg and high transparency to visible light, the percentage of the first transparent resin in the resin substrate is preferably 95 mass %, and it is particularly preferred that the resin substrate is composed of the first transparent resin.

In the case where the thickness of the resin substrate is 20 µm or more, the strength of the present filter is sufficient, and in the case where the thickness thereof is 110 µm, the present filter has high transparency to visible light. The thickness of the resin substrate is preferably 40 µm or more, more preferably 60 µm or more. The thickness of the resin substrate is preferably 100 µm or less, more preferably 90 µm or less.

In the case where Tg of the first transparent resin is 170° C. or more, deformation due to heat or stress is less likely to occur and in the present filter, the dielectric multilayer film has excellent adhesiveness. Tg is preferably 200° C. or more, more preferably 210° C. or more. The upper limit of Tg is not particularly specified, but in view of forming processability, etc., Tg of the first transparent resin is preferably 400° C. or less.

In the first transparent resin, in the case where the thickness thereof is 100 in a spectral transmittance curve over a wavelength range of 350 nm to 1,100 nm, the average internal transmittance (hereinafter, denoted by "$T_{350-450ave(TR)}$") in a wavelength range of 350 nm to 450 nm is 95% or more, the minimum internal transmittance (hereinafter, denoted by "$T_{400-450min(TR)}$") in a wavelength range of 400 nm to 450 nm is 97% or more, and the wavelength (hereinafter, denoted by "$\lambda_{uv90}$") at which the internal transmittance becomes 90% in a wavelength range of 500 nm or less is 350 nm or less. In the case where $T_{350-450ave(TR)}$ is 95% or more, $T_{400-450min(TR)}$ is 97% or more, and $\lambda_{uv90}$ is 350 nm or less, the present filter has a high visible light transmittance.

In the first transparent resin, $T_{350-450ave(TR)}$ is preferably 97% or more, more preferably 98% or more. $T_{400-450min(TR)}$ is preferably 97.5% or more, more preferably 98% or more. $\lambda_{uv90}$ is preferably 340 nm or less.

As long as the above-described requirements are satisfied, the material of the first transparent resin is not particularly limited. The material is preferably one or more selected from polyimide resins and polycarbonate resins each satisfying the requirements above.

The preferable Tg in the first transparent resin differs depending on the resin, but in a polyimide resin, Tg is preferably from 200° C. to 400° C. and is preferably from 200° C. to 350° C. In a polycarbonate resin, Tg is preferably from 200° C. to 300° C. and is preferably from 200° C. to 250° C.

It is preferred that the first transparent resin contains at least one resin selected from polycarbonate resins having a glass transition temperature of 200° C. or more and polyimide resins, in the first transparent resin, $T_{350-450ave(TR)}$ is 98% or more, $T_{400-450min(TR)}$ is 98% or more, and $\lambda_{uv90}$ is 340 nm or less.

Examples of the polyimide resin as the first transparent resin include, out of known transparent polyimide compounds described in JP-A-2013-223759 or International Publication WO2013/146460, transparent resins satisfying the requirements of the first transparent resin.

Specific examples of the structure include a structure of a typical transparent polyimide obtained by polycondensation (imide bonding) of a tetracarboxylic acid or a dihydrate thereof with a diamine and, more specifically, include a polyimide resin (TR-1) represented by the following formula (TR-1):

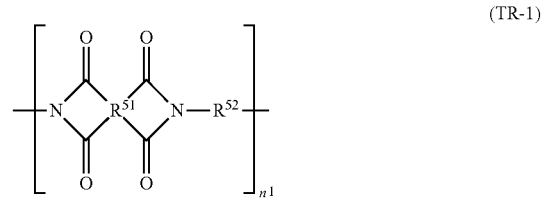

(TR-1)

In formula (TR-1), $R^{51}$ is a tetravalent group with a carbon number of 4 to 10 having a cyclic structure, an acyclic structure, or both of a cyclic structure and an acyclic structure. $R^{52}$ is a divalent group with a carbon number of 2 to 39 having at least one group selected from the group consisting of an aliphatic hydrocarbon group, an alicyclic hydrocarbon group, an aromatic hydrocarbon group, and an organosiloxane group, and at least one group selected from the group consisting of —O—, —SO$_2$—, —CO—, —CH$_2$—, —C(CH$_3$)$_2$—, —C$_2$H$_4$O—, and —S— may intervene in a main chain of $R^{52}$. In the formula, n1 indicates that it is a repeating unit, and n1 is appropriately adjusted according to the physical properties required.

Preferable examples of $R^{51}$ in formula (TR-1) include a tetravalent group formed by removing four hydrogen atoms from cyclohexane, cyclopentane, cyclobutane, bicyclopentane, bicyclooctane, or a stereoisomer thereof and, more specifically, include tetravalent groups represented by the following structural formulae:

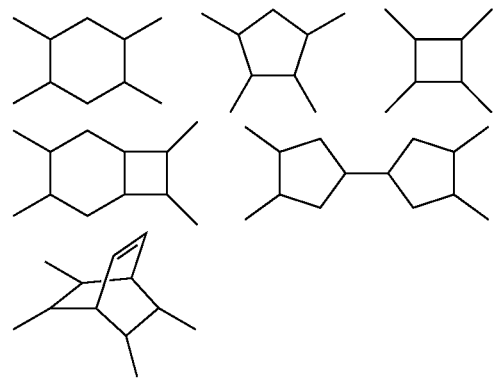

Examples of the commercially available polyimide resin film that can be used as the first transparent resin include NEOPRIM (registered trademark) L-3G30 (trade name, produced by Mitsubishi Gas Chemical Company, Inc.) (silica may be contained in this polyimide resin film), etc.

The first transparent resin may be produced from a polyimide resin varnish, and examples of the polyimide resin varnish that can be used include NEOPRIM (registered trademark)C-3G30 (trade name, produced by Mitsubishi Gas Chemical Company, Inc.).

Examples of the polycarbonate resin as the first transparent resin include, out of known transparent polycarbonate compounds described in JP-A-2001-296423, transparent resins satisfying the requirements of the first transparent resin.

Examples of the polycarbonate resin that can satisfy the requirements of the first transparent resin include a structure of a typical transparent polycarbonate resin obtained by polymerization using a diol component of a bisphenol structure and a carbonate-forming component, for example, phosgenes or carbonates such as diphenyl carbonate, and, more specifically, include a polycarbonate resin (TR-2) represented by the following formula (TR-2). Formula (TR-2) shows a copolymer and/or blend of two units each enclosed in square brackets ([ ])

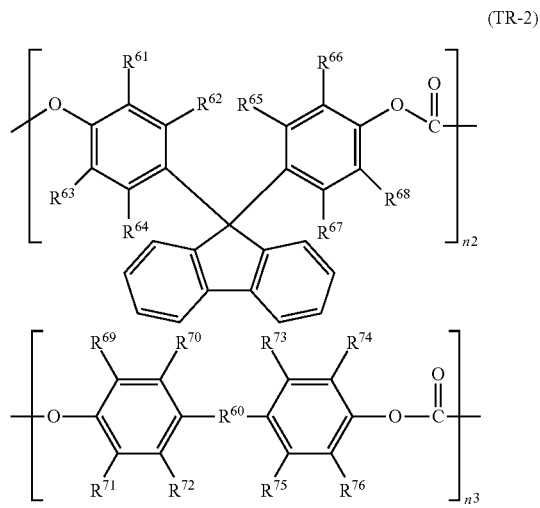

(TR-2)

In formula (TR-2), each of $R^{61}$ to $R^{68}$ is independently a hydrogen atom, a halogen atom, or a monovalent hydrocarbon group with a carbon number of 1 to 6. Each of $R^{69}$ to $R^{76}$ is independently a hydrogen atom, a halogen atom, or a monovalent hydrocarbon group with a carbon number of 1 to 22. $R^{60}$ is a divalent group represented by the following structural formula:

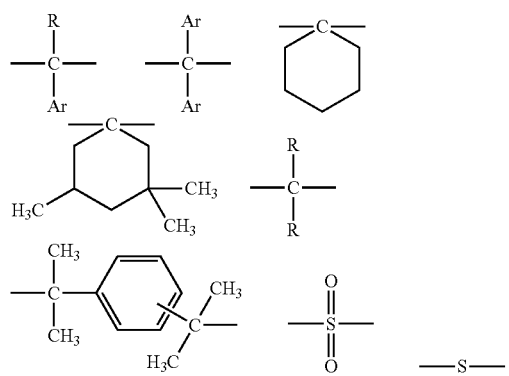

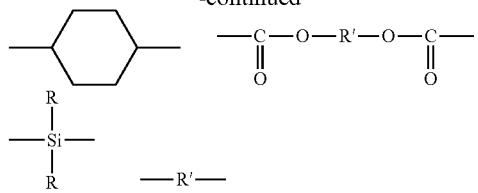

Each R is independently a hydrogen atom, a halogen atom, or a monovalent hydrocarbon group with a carbon number of 1 to 22, each R' is independently a divalent hydrocarbon group with a carbon number of 1 to 20, and Ar is an aryl group with a carbon number of 6 to 10. In formula (TR-2), n2 and n3 are mol % of respective units in a copolymer and/or a blend, and n2 is from 30 to 90 mol %, and n3 is from 70 to 10 mol %.

Examples of the commercially available polycarbonate resin that can be used as the first transparent resin include PURE-ACE (registered trademark) M5 (trade name, produced by Teijin Limited), PURE-ACE (registered trademark) S5 (trade name, produced by Teijin Limited), etc.

The resin substrate contains the first transparent resin as a main component. The resin substrate may contain, if desired, optional components in the range not impairing the effects of the present invention, for example, in the range of 10 mass % or less. Examples of the optional component include an adhesion-imparting agent, a leveling agent, an antistatic agent, a heat stabilizer, a light stabilizer, an antioxidant, a dispersing agent, a flame retardant, a lubricant, a plasticizer, etc.

Incidentally, in the resin substrate containing the first transparent resin as a main component, as with the first transparent resin, Tg is preferably 170° C. or more, and it is preferred that when the thickness thereof is 100 μm, in a spectral transmittance curve over a wavelength range of 350 nm to 1,100 nm, the average internal transmittance in a wavelength range of 350 nm to 450 nm is 95% or more, the minimum internal transmittance in a wavelength range of 400 nm to 450 nm is 97% or more, and the wavelength at which the internal transmittance becomes 90% in a wavelength range of 500 nm or less is 350 nm or less. In the resin substrate, it is more preferred that the average internal transmittance in a wavelength range of 350 nm to 450 nm and the minimum internal transmittance in a wavelength range of 400 nm to 450 nm are 98% or more and the wavelength at which the internal transmittance becomes 90% in a wavelength range of 500 nm or less is 340 nm or less. Furthermore, more preferred embodiments of Tg and the optical properties above can also be the same as those in the first transparent resin.

The resin substrate can be produced, for example, by the following method. The resin substrate can be produced by melt-extruding the first transparent resin or a mixture of the first transparent resin and optional components and forming it into a film shape. In addition, the resin substrate can be produced by dissolving the first transparent resin and, if desired, optional components in a solvent to prepare a coating solution, applying the solution to a releasable base material for manufacturing a resin substrate in a desired thickness, drying the coating, curing it if desired, and then separating the resin substrate from the base material.

The solvent used for the coating solution is not particularly limited as long as the solvent is a dispersion medium or solvent capable of stably dispersing or dissolving the first transparent resin. The coating solution may contain a surfactant so as to improve, for example, voids due to microbubbles, dents due to adhesion of foreign materials, cissing in a drying step, etc. Furthermore, in applying the coating solution, for example, a dip coating method, a cast coating method, a die coating method, a spin coating method, etc. can be used.

[Absorption Layer]

The absorption layer has a thickness of 0.25 μm or more and 12 μm or less and contains an NIR dye (A) and a second transparent resin having Tg of 170° C. or more, and the relationship between the NIR dye (A) and the second transparent resin satisfies (ii-1) and (ii-2). It is preferable for the NIR dye (A) to satisfy (i-1) and (i-2). The absorption layer is, typically, a layer where the NIR dye (A) is uniformly dissolved or dispersed in the second transparent resin.

In the case where the thickness of the absorption layer is 0.25 μm or more, the present filter can have sufficient shielding property for near-infrared light, and in the case where the thickness thereof is 12 μm or less, the present filter has high transparency to visible light. The thickness of the absorption layer is preferably 0.4 μm or more, more preferably 0.6 μm or more. The thickness of the absorption layer is preferably 5 μm or less, more preferably 2 μm or less. In the case of having two absorption layers as in the optical filter 10B illustrated in FIG. 2, the total thickness of the absorption layers is preferably 12 μm or less, more preferably 5 μm or less, still more preferably 3 μm or less. In this case, the thickness of each absorption layer is, for example, preferably 1.5 μm or less, more preferably 1.4 μm or less.

The absorption layer may contain, in addition to the NW dye (A), another NW dye in the range not impairing the effects of the present invention. Furthermore, the absorption layer may contain a dye other than the NW dye, particularly, a UV dye, in the range not impairing the effects of the present invention.

(NIR Dye (A))

The relationship of the NIR dye (A) with the second transparent resin satisfies the requirements of (ii-1) and (ii-2). It is preferable for the NIR dye (A) to satisfy the requirements of (i-1) and (i-2) above.

As for the NIR dye (A), in (ii-1), $\lambda_{max(A)TR}$ is present in a wavelength range of 680 nm to 745 nm. $\lambda_{max(A)TR}$ is more preferably present in a wavelength range of 690 nm to 730 nm.

As for the NIR dye (A), in (ii-2), both $T_{435-500ave(A)TR}$ and $T_{500-600ave(A)TR}$ are 94% or more. $T_{435-500ave(A)TR}$ is preferably 95% or more, more preferably 96% or more. $T_{500-600ave(A)TR}$ is preferably 95% or more, more preferably 96% or more.

As for the NIR dye (A), in (i-1), $\lambda_{max(A)DCM}$ is preferably present in a wavelength range of 670 nm to 735 nm. $\lambda_{max(A)DCM}$ is more preferably present in a wavelength range of 680 nm to 720 nm.

As for the NIR dye (A), in (i-2), it is preferred that $T_{435-500ave(A)DCM}$ is 94% or more and $T_{500-600ave(A)DCM}$ is 94% or more. $T_{435-500ave(A)DCM}$ is more preferably 95% or more, still more preferably 96% or more. $T_{500-600ave(A)DCM}$ is more preferably 95% or more, still more preferably 96% or more.

In the case of using the NIR dye (A) satisfying satisfies the requirements of (ii-1) and (ii-2) and preferably satisfying the requirements of (i-1) and (i-2) in a relationship with the second transparent resin, in the present filter, both high visible light transmittance and good NIR shielding property can be achieved.

As long as the relationship with the second transparent resin satisfies the requirements of (ii-1) and (ii-2) and preferably satisfies the requirements of (i-1) and (i-2), the molecular structure of the NIR dye (A) is not particularly limited. Specific examples of the NIR dye (A) include a squarylium dye and, more specifically, the NIR dye (A) is preferably a squarylium dye represented by the following formula (I) or formula (II):

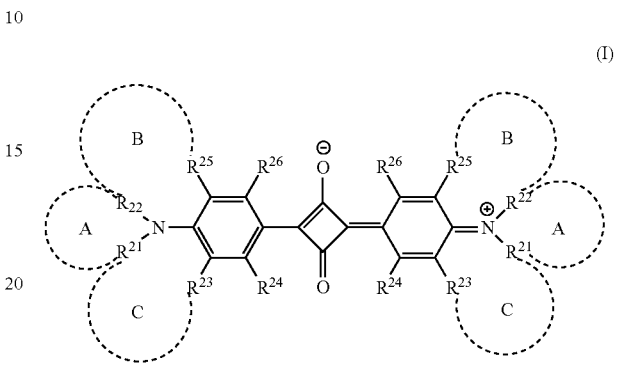

Here, symbols in formula (I) are as follows.

Each of $R^{24}$ and $R^{26}$ independently represents a hydrogen atom, a halogen atom, a hydroxyl group, an alkyl or alkoxy group with a carbon number of 1 to 20, an acyloxy group with a carbon number of 1 to 10, an aryl group with a carbon number of 6 to 11, an alaryl group with a carbon number of 7 to 18 which may have a substituent and may have an oxygen atom between carbon atoms, $-NR^{27}R^{28}$ (in which each of $R^{27}$ and $R^{28}$ independently represents a hydrogen atom, an alkyl group with a carbon number of 1 to 20, $-C(=O)-R^{29}$ (in which $R^{29}$ is a hydrogen atom, a halogen atom, a hydroxyl group, or a hydrocarbon group with a carbon number of 1 to 25 which may have a substituent and may contain, between carbon atoms, an unsaturated bond, an oxygen atom or a saturated or unsaturated ring structure), $-NHR^{30}$, or $-SO_2-R^{30}$ (in which each $R^{30}$ represents a hydrocarbon group with a carbon number of 1 to 25 in which one or more hydrogen atoms may be substituted by a halogen atom, a hydroxyl group, a carboxy group, a sulfo group or a cyano group and which may contain, between carbon atoms, an unsaturated bond, an oxygen atom or a saturated or unsaturated ring structure)), or a group represented by the following formula (S) (in which $R^{41}$ and $R^{42}$ independently represent a hydrogen atom, a halogen atom, or an alkyl or alkoxy group with a carbon number of 1 to 10, and k is 2 or 3).

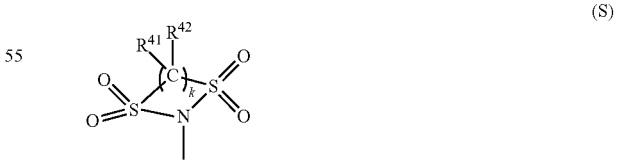

$R^{21}$ and $R^{22}$, $R^{22}$ and $R^{25}$, and $R^{21}$ and $R^{23}$ may combine with each other to form, respectively, a heterocyclic ring A, a heterocyclic ring B, and a heterocyclic ring C, together with a nitrogen atom, each ring having 5 or 6 ring members.

$R^{21}$ and $R^{22}$, when forming heterocyclic ring A, represent, as a divalent group -Q-formed by bonding $R^{21}$ and $R^{22}$, an alkylene or alkyleneoxy group in which a hydrogen atom may be substituted by an alkyl group with a carbon number of 1 to 6, an aryl group with a carbon number of 6 to 10, or an acyloxy group with a carbon number of 1 to 10 which may have a substituent.

$R^{22}$ and $R^{25}$, when forming heterocyclic ring B, and $R^{21}$ and $R^{23}$, when forming heterocyclic ring C, represent, as divalent groups —$X^1$—$Y^1$— and —$X^2$—$Y^2$— (in which a side bonded to nitrogen is $X^1$ and $X^2$) formed by bonding $R^{22}$ and $R^{25}$, and $R^{21}$ and $R^{23}$, respectively, groups in which each of $X^1$ and $X^2$ is a group represented by the following formula (1x) or (2x) and each of $Y^1$ and $Y^2$ is a group represented by any one selected from the following formulae (1y) to (5y). In the case where each of $X^1$ and $X^2$ is a group represented by the following formula (2x), each of $Y^1$ and $Y^2$ may be a single bond, and in this case, the group may have an oxygen atom between carbon atoms.

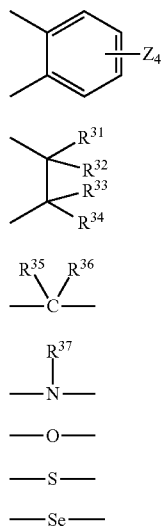

(1x)

(2x)

(1y)

(2y)

(3y)

(4y)

(5y)

Each of four Z in formula (1x) independently represents a hydrogen atom, a hydroxyl group, an alkyl or alkoxy group with a carbon number of 1 to 6, or —$NR^{38}R^{39}$ (in which each of $R^{38}$ and $R^{39}$ independently represents a hydrogen atom or an alkyl group with a carbon number of 1 to 20). Each of $R^{31}$ to $R^{36}$ independently represents a hydrogen atom, an alkyl group with a carbon number of 1 to 6, or an aryl group with a carbon number of 6 to 10, and $R^{37}$ represents an alkyl group with a carbon number of 1 to 6 or an aryl group with a carbon number of 6 to 10.

$R^{27}$, $R^{28}$, $R^{29}$, $R^{31}$ to $R^{37}$, $R^{21}$ to $R^{23}$ when not forming a heterocyclic ring, and $R^{25}$ may combine with any other member among these to form a 5- or 6-membered ring. $R^{31}$ and $R^{36}$, and $R^{31}$ and $R^{37}$ may be bonded directly.

Each of $R^{21}$, $R^{22}$, $R^{23}$ and $R^{25}$ when not forming a heterocyclic ring independently represents a hydrogen atom, a halogen atom, a hydroxyl group, an alkyl or alkoxy group with a carbon number of 1 to 20, an acyloxy group with a carbon number of 1 to 10, an aryl with a carbon number of 6 to 11, or an alaryl group with a carbon number of 7 to 18 which may have a substituent and may have an oxygen atom between carbon atoms.

Here, in formula (I), unless specified otherwise, the hydrocarbon group is an alkyl group, an aryl group, or an alaryl group. Unless specified otherwise, the alkyl group and the alkyl moiety in an alkoxy group, an aryl group or an alaryl group may have a linear, branched or cyclic structure or a structure formed by combining these structures. The same holds true for the alkyl group, alkoxy group, aryl group and alaryl group in other formulae set forth below. In formula (I), examples of the substituent in $R^{29}$ include a halogen atom, a hydroxyl group, a carboxy group, a sulfo group, a cyano group, and an acyloxy group with a carbon number of 1 to 6. Examples of the substituent in the case of "may have a substituent", except for $R^{29}$, include a halogen atom and an alkoxy group with a carbon number of 1 to 15. Examples of the halogen atom include fluorine atom, chlorine atom, bromine atom, iodine atom, etc. Fluorine atom and chlorine atom are preferred.

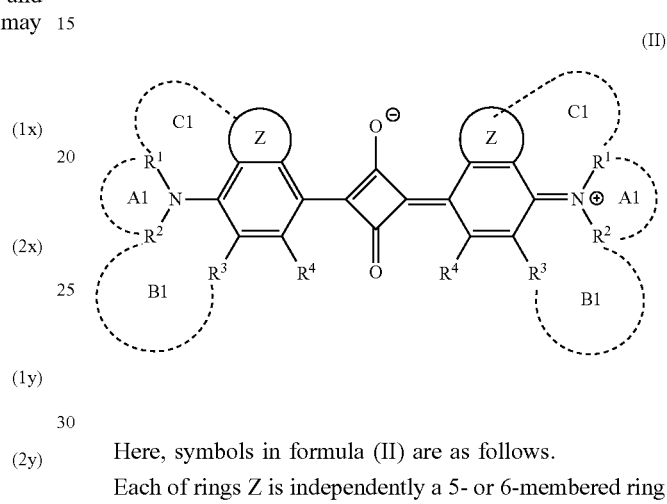

(II)

Here, symbols in formula (II) are as follows.

Each of rings Z is independently a 5- or 6-membered ring having from 0 to 3 heteroatoms in the ring, and a hydrogen atom contained in ring Z may be substituted. In the case where a hydrogen atom is substituted, examples of the substituent include a halogen atom and an alkyl group with a carbon number of 1 to 10 which may have a substituent.

$R^1$ and $R^2$, $R^2$ and $R^3$, and $R^1$ and a carbon atom or heteroatom constituting ring Z may combine with each other to form, respectively, a heterocyclic ring A1, a heterocyclic ring B1, and a heterocyclic ring C1, together with a nitrogen atom, and in this case, a hydrogen atom contained in the heterocyclic ring A1, heterocyclic ring B1 and heterocyclic ring C1 may be substituted. In the case where a hydrogen atom is substituted, examples of the substituent include a halogen atom and an alkyl group with a carbon number of 1 to 15 which may have a substituent.

Each of $R^1$ and $R^2$ when not forming a heterocyclic ring independently represents a hydrogen atom, a halogen atom, or a hydrocarbon group which may contain, between carbon atoms, an unsaturated bond, a heteroatom, or a saturated or unsaturated ring structure and may have a substituent. Each of $R^4$ and $R^3$ when not forming a heterocyclic ring independently represents a hydrogen atom, a halogen atom, or an alkyl or alkoxy group which may contain a heteroatom between carbon atoms and may have a substituent.

In formula (II), the carbon number of the hydrocarbon group is from 1 to 15. The carbon number of the alkyl or alkoxy group is from 1 to 10. In formula (II), examples of the substituent in the case of "may have a substituent" include a halogen atom and an alkoxy group with a carbon number of 1 to 10. Examples of the halogen atom include fluorine atom, chlorine atom, bromine atom, iodine atom, etc. Fluorine atom and chlorine atom are preferred.

Examples of the compound (I) include compounds represented by any of formulae (I-1) to (I-4):

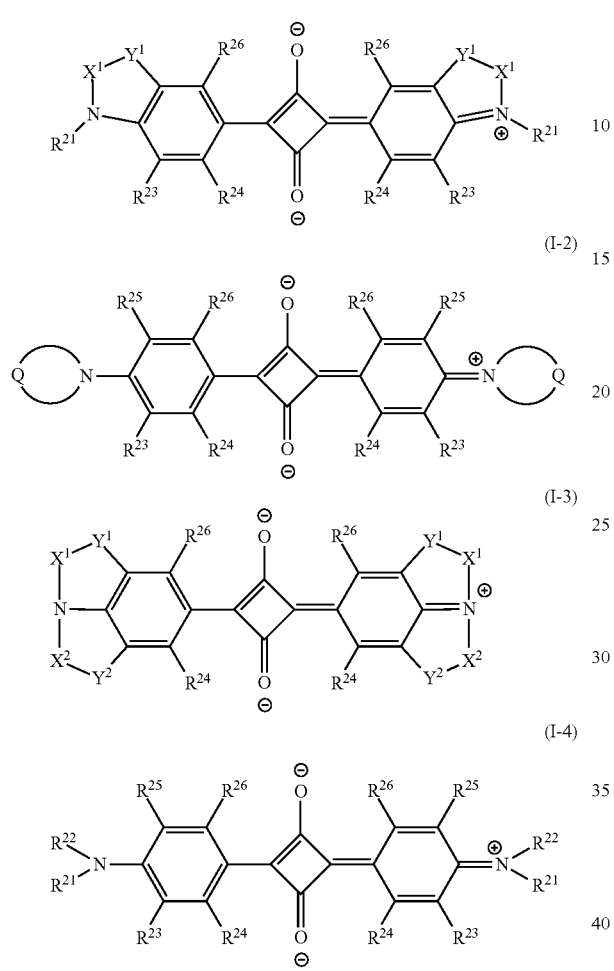

Here, symbols in formulae (I-1) to (I-4) are the same as respective definitions of the same symbols in formula (I), and preferable embodiments are also the same.

Among compounds (I-1) to (I-4), as the NIR dye (A), from the viewpoint that the visible light transmittance of the absorption layer can be increased, compounds (I-1) to (I-3) are preferred, and compound (I-1) is particularly preferred.

In the compound (I-1), $X^1$ is preferably a group (2x), and $Y^1$ is preferably a single bond or a group (1y). In this case, $R^{31}$ to $R^3$ are preferably a hydrogen atom or an alkyl group with a carbon number of 1 to 3, more preferably a hydrogen atom or a methyl group. Specific examples of —$Y^1$—$X^1$— include divalent organic groups represented by formulae (11-1) to (12-3).

—C(CH$_3$)$_2$—CH(CH$_3$)— (11-1)

—C(CH$_3$)$_2$—CH$_2$— (11-2)

—C(CH$_3$)$_2$—CH(C$_2$H$_5$)— (11-3)

—C(CH$_3$)$_2$—C(CH$_3$)(nC$_3$H$_7$)— (11-4)

—C(CH$_3$)$_2$—CH$_2$—CH$_2$— (12-1)

—C(CH$_3$)$_2$—CH$_2$—CH(CH$_3$)— (12-2)

—C(CH$_3$)$_2$—CH(CH$_3$)—CH$_2$— (12-3)

Furthermore, in the compound (I-1), in view of solubility, heat resistance and steepness of change in the vicinity of boundary between the visible region and the near-infrared region in a spectral transmittance curve, $R^{21}$ is independently, more preferably a group represented by formula (4-1) or (4-2):

(4-1)

(4-2)

In formulae (4-1) and (4-2), $R^{81}$ to $R^{85}$ independently represent a hydrogen atom, a halogen atom, or an alkyl group with a carbon number of 1 to 4.

In the compound (I-1), $R^{24}$ is preferably —NR$^{27}$R$^{28}$. In view of solubility in a second transparent resin or a solvent (hereinafter, sometimes referred to as "host solvent") used at the time of forming an absorption layer on the resin substrate, —NR$^{27}$R$^{28}$ is preferably —NH—C(=O)—R$^{29}$. A compound which is the compound (I-1) where $R^{24}$ is —NH—C(=O)—R$^{29}$ is represented by formula (I-11):

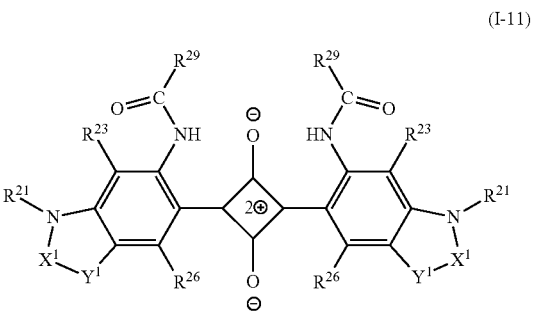

(I-11)

In the compound (I-11), $R^{23}$ and $R^{26}$ are independently, preferably a hydrogen atom, a halogen atom, or an alkyl or alkoxy group with a carbon number of 1 to 6, and it is more preferred that both are a hydrogen atom.

In the compound (I-11), $R^{29}$ is preferably an alkyl group with a carbon number of 1 to 20 which may have a substituent, an aryl group with a carbon number of 6 to 10 which may have a substituent, or an alaryl group with a carbon number of 7 to 18 which may have a substituent and may have an oxygen atom between carbon atoms. Examples of the substituent include a halogen atom such as fluorine atom, a hydroxyl group, a carboxy group, a sulfo group, a cyano group, an alkyl group with a carbon number of 1 to 6, a fluoroalkyl group with a carbon number of 1 to 6, an alkoxy group with a carbon number of 1 to 6, an acyloxy group with a carbon number of 1 to 6, etc.

$R^{29}$ is preferably a hydrogen atom, a halogen atom, a hydroxyl group, an alkyl or alkoxy group with a carbon number of 1 to 20, an acyloxy group with a carbon number of 1 to 10, an aryl group with a carbon number of 6 to 11, or an alaryl group with a carbon number of 7 to 18 which may have a substituent and may have an oxygen atom between carbon atoms.

$R^{29}$ is preferably a group selected from a linear, branched or cyclic alkyl group with a carbon number of 1 to 17 which may be substituted by fluorine atom, a phenyl group which may be substituted by a fluoroalkyl group with a carbon number of 1 to 6 and/or an alkoxy group with a carbon number of 1 to 6, and an alaryl group with a carbon number of 7 to 18 which may have an oxygen atom between carbon atoms and has, on its terminal, an alkyl group with a carbon number of 1 to 6 which may be substituted by fluorine atom, and/or a phenyl group which may be substituted by an alkoxy group with a carbon number of 1 to 6.

As $R^{29}$, a group that is a hydrocarbon group with a carbon number of 5 to 25 having at least one branch, in which one or more hydrogen atoms may be independently substituted by a halogen atom, a hydroxyl group, a carboxy group, a sulfo group, or a cyano group, and which may contain, between carbon atoms, an unsaturated bond, an oxygen atom, or a saturated or unsaturated ring structure, may also be preferably used. Examples of such $R^{29}$ include groups represented by the following formulae (1a), (1b), (2a) to (2e), and (3a) to (3e).

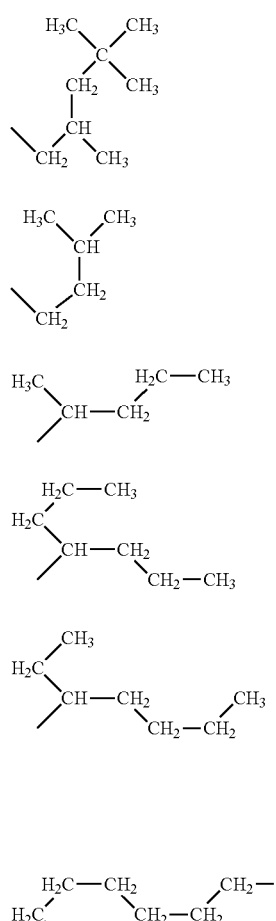

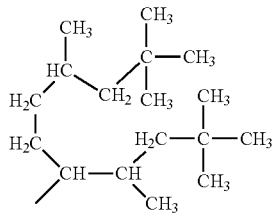

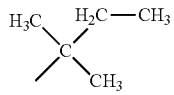

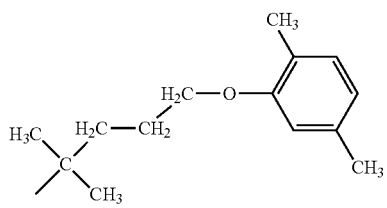

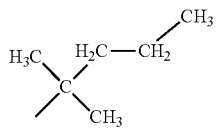

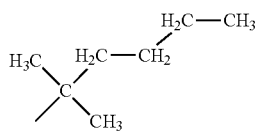

Specific examples of the compound (I-11) include compounds shown in Table 1 below. In Table 1, the group (11-1) is denoted by (11-1). The same holds true for other groups. The notation of the group is the same also in other Tables set forth below. In addition, in all compounds shown in Table 1, each symbol has the same meaning between right and left of the squarylium skeleton. The same holds true for squarylium dyes shown in other Tables set forth below.

TABLE 1

| Abbr. of Dye | Substituent |  |  |  |  |
|---|---|---|---|---|---|
|  | —Y$^1$—X$^1$— | R$^{21}$ | R$^{29}$ | R$^{23}$ | R$^{26}$ |
| I-11-1 | (11-1) | —CH$_3$ | (2b) | H | H |
| I-11-2 | (11-1) | —CH$_3$ | (2c) | H | H |
| I-11-3 | (11-1) | —CH$_3$ | (2d) | H | H |
| I-11-4 | (11-1) | —CH$_3$ | (2e) | H | H |
| I-11-5 | (11-1) | —CH$_2$CH$_3$ | (2c) | H | H |
| I-11-6 | (11-1) | —CH$_2$CH$_2$CH$_3$ | (2c) | H | H |
| I-11-7 | (11-1) | —CH(CH$_3$)$_2$ | (2c) | H | H |
| I-11-8 | (11-1) | —CH$_2$CH$_3$ | (3b) | H | H |
| I-11-9 | (11-1) | —CH$_3$ | (1b) | H | H |
| I-11-10 | (11-1) | —CH$_3$ | (2a) | H | H |
| I-11-11 | (11-1) | —CH$_3$ | (1a) | H | H |
| I-11-12 | (11-1) | —CH$_3$ | (3a) | H | H |
| I-11-13 | (11-1) | —CH$_3$ | (3b) | H | H |
| I-11-14 | (11-1) | —CH$_3$ | (3c) | H | H |

TABLE 1-continued

| Abbr. of Dye | —Y¹—X¹— | R²¹ | R²⁹ | R²³ | R²⁶ |
|---|---|---|---|---|---|
| I-11-15 | (11-1) | —C(CH₃)₂CH₂CH₃ | (2c) | H | H |
| I-11-16 | (11-1) | —C(CH₃)₂CH₂CH₃ | (3b) | H | H |
| I-11-17 | (11-1) | —C(CH₃)₂CH₂CH₃ | (3c) | H | H |
| I-11-18 | (11-1) | —C(CH₃)₂CH₂CH₃ | (3d) | H | H |
| I-11-19 | (11-1) | —C(CH₃)₂CH₂CH₃ | (3e) | H | H |
| I-11-20 | (11-1) | —CH(CH₃)₂ | —C₂F₅ | H | H |

In the compound (I-1), from the viewpoint of increasing the visible light transmittance, particularly, transmittance of light in a wavelength range of 430 nm to 550 nm, $R^{24}$ is preferably —N—SO₂—$R^{30}$. A compound wherein the compound (I-1), $R^{24}$ is —NH—SO₂—$R^{30}$, is represented by formula (I-12):

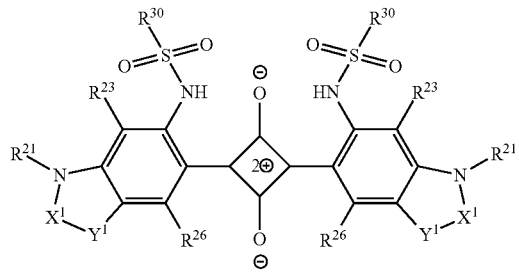

(I-12)

In the compound (I-12), $R^{23}$ and $R^{26}$ are independently, preferably a hydrogen atom, a halogen atom, or an alkyl or alkoxy group with a carbon number of 1 to 6, and more preferably a hydrogen atom for both.

In the compound (I-12), in view of light resistance, $R^{30}$ is independently, preferably an alkyl or alkoxy group with a carbon number of 1 to 12 which may have a branch, or a hydrocarbon group with a carbon number of 6 to 16 having an unsaturated ring structure. Examples of the unsaturated ring structure include benzene, toluene, xylene, furan, benzofuran, etc. $R^{30}$ is independently, more preferably an alkyl or alkoxy group with a carbon number of 1 to 12 which may have a branch. In each group that $R^{30}$ represents, part or all of hydrogen atoms may be substituted by a halogen atom, particularly, by fluorine atom. Incidentally, substitution for hydrogen atom by fluorine atom is performed to such an extent as to cause no reduction of adhesion between the absorption layer containing the dye (I-12) and the resin substrate.

Specific examples of $R^{30}$ having an unsaturated ring structure include groups represented by the following formulae (P1) to (P8).

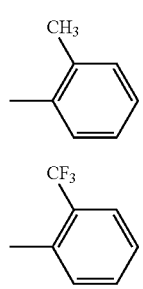

(P1)

(P2)

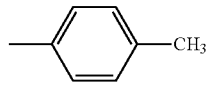

(P3)

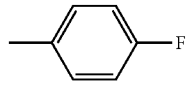

(P4)

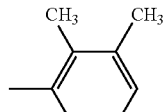

(P5)

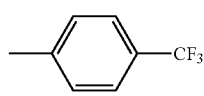

(P6)

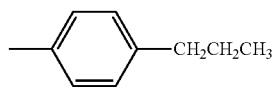

(P7)

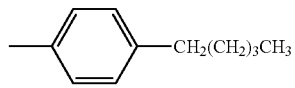

(P8)

More specifically, examples of the compound (I-12) include compounds shown in Table 2 below.

TABLE 2

| Abbr. of Dye | —Y¹—X¹— | R²¹ | R³⁰ | R²³ | R²⁶ |
|---|---|---|---|---|---|
| I-12-1 | (11-1) | —CH₃ | —CH₂(CH₂)₆CH₃ | H | H |
| I-12-2 | (11-1) | —CH₃ | —CF₃ | H | H |
| I-12-3 | (11-1) | —CH₃ | —CF₂(CF₂)₂CF₃ | H | H |
| I-12-4 | (11-1) | —CH₃ | (P2) | H | H |
| I-12-5 | (11-1) | —CH₃ | (P5) | H | H |
| I-12-6 | (11-1) | —CH₃ | (P7) | H | H |
| I-12-7 | (11-1) | —CH₃ | (P8) | H | H |
| I-12-8 | (11-1) | —CH₃ | (P6) | H | H |
| I-12-9 | (11-1) | —CH(CH₃)₂ | —CF₃ | H | H |
| I-12-10 | (11-1) | —CH(CH₃)₂ | —CH(CH₃)₂ | H | H |
| I-12-11 | (11-1) | —CH(CH)₂ | (P4) | H | H |
| I-12-12 | (11-1) | —CH(CH₃)₂ | (P3) | H | H |
| I-12-13 | (11-1) | —CH(CH₃)₂ | —CH₂CH₂CH₃ | H | H |
| I-12-14 | (11-1) | —CH(CH₃)₂ | (P7) | H | H |
| I-12-15 | (11-1) | —CH(CH₃)₂ | —CH₂(CH₂)₆CH₃ | H | H |
| I-12-16 | (11-1) | —CH(CH₃)₂ | (P6) | H | H |
| I-12-17 | (11-1) | —CH(CH₃)₂ | —CF₂(CF₂)₂CF₃ | H | H |
| I-12-18 | (11-1) | —CH(CH₃)₂ | (P1) | H | H |
| I-12-19 | (11-1) | —CH(CH₃)₂ | (P8) | H | H |
| I-12-20 | (11-1) | —C(CH₃)₂CH₂CH₃ | —CH₂(CH₂)₆CH₃ | H | H |
| I-12-21 | (11-1) | —C(CH₃)₂CH₂CH₃ | —CF₃ | H | H |
| I-12-22 | (11-1) | —C(CH₃)₂CH₂CH₃ | —CF₂(CF₂)₂CF₃ | H | H |
| I-12-23 | (11-4) | —CH(CH₃)₂ | —CH₂(CH₂)₆CH₃ | H | H |
| I-12-24 | (11-4) | —CH(CH₃)₂ | —CF₂(CH₂)₂CF₃ | H | H |
| I-12-25 | (11-4) | —CH₃ | —CH₂(CH₂)₆CH₃ | H | H |

Examples of the compound (I) include compounds represented by any of formulae (II-1) to (I-3):

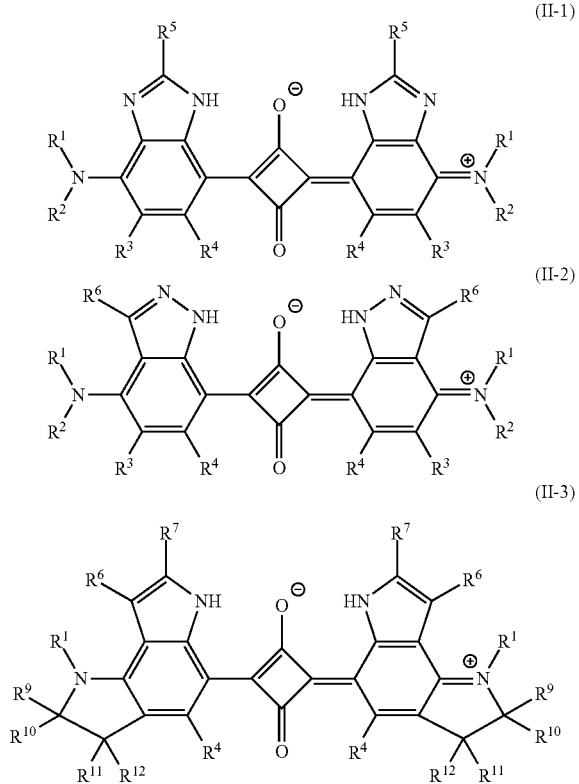

In formulae (II-1) and (II-2), each of $R^1$ and $R^2$ independently represents a hydrogen atom, a halogen atom, or an alkyl group with a carbon number of 1 to 15 which may have a substituent, and each of $R^3$ to $R^6$ independently represents a hydrogen atom, a halogen atom, or an alkyl group with a carbon number of 1 to 10 which may have a substituent.

In formula (II-3), each of $R^1$, $R^4$, and $R^9$ to $R^{12}$ independently represents a hydrogen atom, a halogen atom, or an alkyl group with a carbon number of 1 to 15 which may have a substituent, and each of $R^7$ and $R^8$ independently represents a hydrogen atom, a halogen atom, or an alkyl group with a carbon number of 1 to 5 which may have a substituent.

In the compounds (II-1) and (II-2), in view of solubility in the transparent resin, transparency to visible light, etc., $R^1$ and $R^2$ are independently, preferably an alkyl group with a carbon number of 1 to 15, more preferably an alkyl group with a carbon number of 7 to 15. It is still more preferred that at least one of $R^1$ and $R^2$ is an alkyl group with a carbon number of 7 to 15 having a branched chain, and it is yet still more preferred that both $R^1$ and $R^2$ are an alkyl group with a carbon number of 8 to 15 having a branched chain.

In view of solubility in the transparent resin, transparency to visible light, etc., $R^3$ is independently, preferably a hydrogen atom, a halogen atom, or an alkyl group with a carbon number of 1 to 3, more preferably a hydrogen atom, a halogen atom, or a methyl group. In view of steepness of change in the vicinity of boundary between the visible region and the near-infrared region, $R^4$ is preferably a hydrogen atom or a halogen atom, more preferably a hydrogen atom. $R^5$ in the compound (II-1) and $R^6$ in the compound (II-2) are independently, preferably a hydrogen atom, a halogen atom, or an alkyl group with a carbon number of 1 to 5 which may be substituted by a halogen atom, more preferably a hydrogen atom, a halogen atom, or a methyl group.

Specific examples of the compound (II-1) and the compound (II-2) include compounds shown in Table 3 and Table 4 below, respectively. In Tables 3 and 4, —$C_8H_{17}$, —$C_4H_9$, and —$C_6H_{13}$ represent a linear octyl group, a linear butyl group, and a linear hexyl group, respectively.

TABLE 3

| Abbr. of Dye | Substituent | | | | |
|---|---|---|---|---|---|
| | $R^1$ | $R^2$ | $R^3$ | $R^4$ | $R^5$ |
| II-1-1 | —$CH_2CH(C_2H_5)(C_4H_9)$ | —$CH_2CH(C_2H_5)(C_4H_9)$ | H | H | H |
| II-1-2 | —$CH_2CH(C_2H_5)(C_4H_9)$ | —$CH_2CH(C_2H_5)(C_4H_9)$ | H | H | —$C(CH_3)_3$ |
| II-1-3 | —$CH_2CH(C_2H_5)(C_4H_9)$ | —$CH_2CH(C_2H_5)(C_4H_9)$ | H | H | —$CF_3$ |
| II-1-4 | —$CH_2CH(C_2H_5)(C_4H_9)$ | —$CH_2CH(C_2H_5)(C_4H_9)$ | H | H | —$CH_3$ |
| II-1-5 | —$CH_2CH(C_2H_5)(C_4H_9)$ | —$CH_2CH(C_2H_5)(C_4H_9)$ | H | H | —$C_8H_{17}$ |
| II-1-6 | —$(CH_2)_2CH(CH_3)_2$ | —$(CH_2)_2CH(CH_3)_2$ | H | H | H |
| II-1-7 | —$CH_2CH(CH_3)_2$ | —$CH_2CH(CH_3)_2$ | H | H | H |
| II-1-8 | —$CH_2CH(C_2H_5)(C_4H_9)$ | —$C_2H_5$ | H | H | H |
| II-1-9 | —$(CH_2)_5CH_3$ | —$(CH_2)_3CH_3$ | H | H | H |
| II-1-10 | —$CH_2CH(C_2H_5)(C_6H_{13})$ | —$CH_2CH(C_2H_5)(C_6H_{13})$ | H | H | H |

TABLE 4

| Abbr. of Dye | Substituent | | | | |
|---|---|---|---|---|---|
| | $R^1$ | $R^2$ | $R^3$ | $R^4$ | $R^6$ |
| II-2-1 | —$(CH_2)_2CH(CH_3)_2$ | —$(CH_2)_2CH(CH_3)_2$ | H | H | H |
| II-2-2 | —$CH_2CH(C_2H_5)(C_4H_9)$ | —$CH_2CH(C_2H_5)(C_4H_9)$ | H | H | H |
| II-2-3 | —$CH_2CH(CH_3)_2$ | —$CH_2CH(CH_3)_2$ | H | H | H |
| II-2-4 | —$CH_2CH(C_2H_5)(C_6H_{13})$ | —$CH_2CH(C_2H_5)(C_6H_{13})$ | H | H | H |

In view of solubility in the transparent resin, transparency to visible light, etc., $R^1$ in the compound (II-3) is independently, preferably an alkyl group with a carbon number of 1 to 15, more preferably an alkyl group with a carbon number of 1 to 10, still more preferably an ethyl group or an isopropyl group.

In view of transparency to visible light and ease of synthesis, $R^4$ is preferably a hydrogen atom or a halogen atom, more preferably a hydrogen atom. $R^7$ and $R^8$ are independently, preferably a hydrogen atom, a halogen atom, or an alkyl group with a carbon number of 1 to 5 which may be substituted by a halogen atom, more preferably a hydrogen atom, a halogen atom, or a methyl group.

$R^9$ to $R^{12}$ are independently, preferably a hydrogen atom, a halogen atom, or an alkyl group with a carbon number of 1 to 5 which may be substituted by a halogen atom. Examples of —$CR^9R^{10}$—$CR^{11}R^{12}$— include the groups (11-1) to (11-3) described above and a divalent organic group represented by the following formula (11-5):

—C(CH$_3$)(CH$_2$—CH(CH$_3$)$_2$)—CH(CH$_3$)—     (11-5)

Examples of the compound (II-3) include, more specifically, compounds shown in Table 5 below.

TABLE 5

| Abbr. of Dye | Substituent —$CR^9R^{10}$—$CR^{11}R^{12}$— | $R^1$ | $R^4$ | $R^7$ | $R^8$ |
|---|---|---|---|---|---|
| II-3-1 | (11-1) | —C$_2$H$_5$ | H | H | H |
| II-3-2 | (11-5) | —C$_2$H$_5$ | H | H | H |
| II-3-3 | (11-1) | —CH(CH$_3$)$_2$ | H | H | —CH$_3$ |

Among these, as the NIR dye (A), in view of solubility in the second transparent resin or host solvent and transparency to visible light, the dye (I-11) and the dye (I-12) are preferred, and dyes (I-11) shown in Table 1 and dyes (I-12) shown in Table 2 are more preferred. Furthermore, among these, Dye (I-11-7), Dye (I-11-20), Dye (I-12-2), Dye (I-12-9), Dye (I-12-15), Dye (I-12-25), etc. are preferred.

The NIR dye (A) may be composed of one kind of a compound or may be composed of two or more kinds of compounds. In the case of being composed of two or more kinds of compounds, individual compounds need not have the properties of the NIR dye (A) as long as a mixture thereof has the properties of the NIR dye (A).

Each of the compound (I) and the compound (II) can be produced by a common method. With respect to the compound (I), the compound (I-11) can be produced, for example, by the method described in U.S. Pat. No. 5,543,086. The compound (I-12) can be produced, for example, by the method described in U.S. Patent Application Publication No. 2014/0061505 and International Publication WO2014/088063. The compound (II) can be produced by the method described in International Publication WO2017/135359.

The content of the NIR dye (A) in the absorption layer varies depending on the thickness of the absorption layer, but in view of NIR shielding property and solubility, it is preferably from 0.1 to 20 parts by mass, more preferably from 1 to 20 parts by mass, per 100 parts by mass of the second transparent resin. In the case where the thickness of the absorption layer is 5 μm or less, the content of the NIR dye (A) in the absorption layer is preferably from 5 to 20 parts by mass, more preferably from 5 to 15 parts by mass, per 100 parts by mass of the second transparent resin.

The absorption layer may contain, in addition to the NIR dye (A), another NR dye in the range not impairing the effects of the present invention. Examples of the another NIR dye include an NIR dye having, in a spectral transmittance curve over a wavelength range of 350 nm to 1,100 nm as measured by dissolving the dye in dichloromethane, a maximum absorption wavelength in a wavelength range of more than 735 nm and 1,200 nm or less.

Examples of the another NIR dye include at least one dye selected from the group consisting of a cyanine dye, a phthalocyanine dye, a naphthalocyanine dye, a dithiol metal complex dye, a diimmonium dye, a polymethine dye, a phthalide dye, a naphthoquinone dye, an anthraquinone dye, an indophenol dye, and a squarylium dye, each having the above-described maximum absorption wavelength.

The NIR dye having a maximum absorption wavelength in the wavelength region of more than 735 nm and 1,200 nm or less is preferably, for example, a squarylium dye represented by the following formula (2):

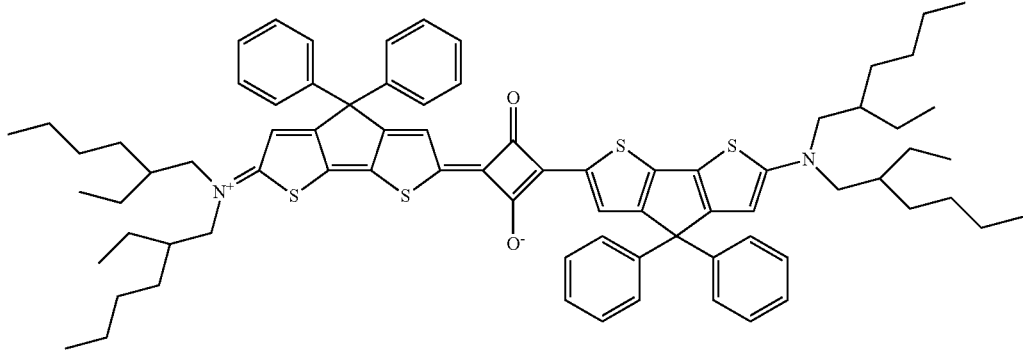

(2)

In the case of using another NIR dye, the content of the another NIR dye in the absorption layer is from 0.1 to 18 parts by mass per 100 parts by mass of the second transparent resin. However, the total content of dyes in the absorption layer is preferably 20 parts by mass or less per 100 parts by mass of the second transparent resin.

(UV Dye)

The UV dye that the absorption layer optionally contains is preferably a UV dye (U) satisfying the requirements of (iii-1) below.

(iii-1) In a spectral transmittance curve over a wavelength range of 350 nm to 1,100 nm as measured in a state of the UV dye (U) being dissolved in dichloromethane, a maximum absorption wavelength $\lambda_{max(U)DCM}$ is in a wavelength range of 380 nm to 420 nm. The maximum absorption wavelength $\lambda_{max(U)DCM}$ of the UV dye (U) is preferably in a wavelength range of 380 nm to 415 nm, more preferably in a wavelength range of 390 nm to 410 nm.

Specific examples of the UV dye (U) include an oxazole dye, a merocyanine dye, a cyanine dye, a naphthalimide dye, an oxadiazole dye, an oxazine dye, an oxazolidine dye, a naphthalic acid dye, a styryl dye, an anthracene dye, a cyclic carbonyl dye, a triazole dye, etc. Among these, an oxazole dye and a merocyanine dye are preferred, and a merocyanine dye is more preferred. As the UV dye (U), one dye may be used alone in the absorption layer, or two or more dyes may be used in combination.

The UV dye (U) preferably further satisfies the requirements of (iii-2) below.

(iii-2) In a spectral transmittance curve over a wavelength range of 350 nm to 1,100 nm as measured in a state of the UV dye (U) being incorporated into dichloromethane such that the transmittance at the maximum absorption wavelength $\lambda_{max(u)DCM}$ becomes 1%, an average transmittance in a wavelength range of 435 nm to 500 nm (hereinafter, referred to as "$T_{435-500ave(u)DCM}$") is 94% or more and an average transmittance in a wavelength range of 500 nm to 600 nm (hereinafter, referred to as "$T_{500-600ave(u)DCM}$") is 94% or more.

$T_{435-500ave(u)DCM}$ is preferably 95% or more, more preferably 96% or more. $T_{500-600ave(u)DCM}$ is preferably 95% or more, more preferably 96% or more.

In the case where a UV dye (U) satisfying (iii-2) as well as (iii-1) is used together with the NIR dye (A), high visible light transmittance and good NIR-shielding and UV-shielding properties can be achieved in the present filter.

The UV dye (U) is preferably, among others, a merocyanine dye represented by formula (M).

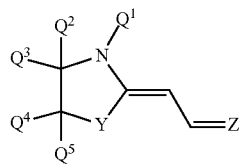
(M)

In formula (M), Y represents a substituted or unsubstituted methylene group or an oxygen atom. Examples of the substituent of the substituted methylene group include a halogen atom and an alkyl or alkoxy group with a carbon number of 1 to 10 and is preferably an alkyl or alkoxy group with a carbon number of 1 to 10. In the case where Y is a substituted or unsubstituted methylene group, Y is preferably an unsubstituted methylene group or a methylene group in which one hydrogen atom is substituted by an alkyl group with a carbon number of 1 to 4, more preferably an unsubstituted methylene group.

$Q^1$ represents a substituted or unsubstituted monovalent hydrocarbon group with a carbon number of 1 to 12. In the case where $Q^1$ is a substituted hydrocarbon group, the substituent is preferably an alkoxy group, an acyl group, an acyloxy group, a cyano group, a dialkylamino group, or a chlorine atom. The carbon number of the alkoxy group, acyl group, acyloxy group and dialkylamino group above is preferably from 1 to 6.

As $Q^1$ not having the above-described substituent, preferred are, specifically, an alkyl group with a carbon number of 1 to 12 in which part of hydrogen atoms may be substituted by an aliphatic ring, an aromatic ring or an alkenyl group, a cycloalkyl group with a carbon number of 3 to 8 in which part of hydrogen atoms may be substituted by an aromatic ring, an alkyl group or an alkenyl group, and an aryl group with a carbon number of 6 to 12 in which part of hydrogen atoms may be substituted by an aliphatic ring, an alkyl group or an alkenyl group.

In the case where $Q^1$ is an unsubstituted alkyl group, the alkyl group may be linear or branched, and the carbon number thereof is more preferably from 1 to 6.

In the case where $Q^1$ is an alkyl group with a carbon number of 1 to 12 in which part of hydrogen atoms is substituted by an aliphatic ring, an aromatic ring or an alkenyl group, $Q^1$ is more preferably an alkyl group with a carbon number of 1 to 4 having a cycloalkyl group with a carbon number of 3 to 6, or an alkyl group with a carbon number of 1 to 4 substituted by a phenyl group, still more preferably an alkyl group with a carbon number of 1 or 2 substituted by a phenyl group. Note that an alkyl group substituted by an alkenyl group means an alkyl group which is an alkenyl group on the whole but does not have an unsaturated bond between 1- and 2-positions, and indicates, for example, an allyl group, a 3-butenyl group, etc.

$Q^1$ is preferably an alkyl group with a carbon number of 1 to 6 in which part of hydrogen atoms may be substituted by a cycloalkyl group or a phenyl group. $Q^1$ is more preferably an alkyl group with a carbon number of 1 to 6, and specific examples thereof include a methyl group, an ethyl group, an n-propyl group, an isopropyl group, an n-butyl group, an isobutyl group, a tert-butyl group, etc.

Each of $Q^2$ to $Q^5$ independently represents a hydrogen atom, a halogen atom, or an alkyl or alkoxy group with a carbon number of 1 to 10. The carbon number of the alkyl group and the alkoxy group is preferably from 1 to 6, more preferably from 1 to 4.

At least one of $Q^2$ and $Q^3$ is preferably an alkyl group, and it is more preferred that both are an alkyl group. In the case where $Q^2$ or $Q^3$ is not an alkyl group, a hydrogen atom is more preferred. In particular, $Q^2$ and $Q^3$ are preferably both an alkyl group with a carbon number of 1 to 6.

At least one of Q4 and $Q^5$ is preferably a hydrogen atom, and it is more preferred that both are a hydrogen atom. In the case where $Q^4$ or $Q^5$ is not a hydrogen atom, an alkyl group with a carbon number of 1 to 6 is preferred.

Z represents any of divalent groups represented by formulae (Z1) to (Z5).

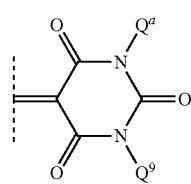
(Z1)

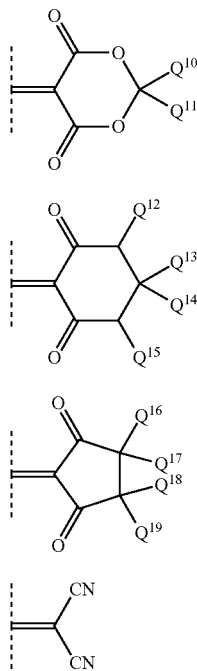

may be substituted by a cycloalkyl group or a phenyl group. $Q^8$ and $Q^9$ are more preferably both an alkyl group with a carbon number of 1 to 6, and specific examples thereof include a methyl group, an ethyl group, an n-propyl group, an isopropyl group, an n-butyl group, an isobutyl group, a tert-butyl group, etc.

In formula (Z2), $Q^{10}$ and $Q^{11}$ are more preferably both an alkyl group with a carbon number of 1 to 6, and they are still more preferably the same alkyl group.

In formula (Z3), $Q^{12}$ and $Q^{15}$ are preferably both a hydrogen atom or an alkyl group with a carbon number of 1 to 6. $Q^{13}$ and $Q^{14}$ which are two groups bonded to the same carbon atom are preferably both a hydrogen atom or both an alkyl group with a carbon number of 1 to 6. In formula (Z4), $Q^{16}$ and $Q^{17}$, and $Q^{18}$ and $Q^{19}$, each pair being two groups bonded to the same carbon atom, are preferably both a hydrogen atom or both an alkyl group with a carbon number of 1 to 6.

As the compound represented by formula (M), a compound where Y is an oxygen atom and Z is a group (Z1) or a group (Z2), and a compound where Y is unsubstituted methylene group and Z is a group (Z1) or a group (Z5), are preferred.

Specific examples of the dye (M) include, more specifically, compounds shown in Table 6 below. In Table 6, —$C_3H_7$ represents an n-propyl group.

TABLE 6

| Abbr. of Dye | $Q^1$ | $Q^2$ | $Q^3$ | $Q^4$ | $Q^5$ | Y | Z | $Q^8$ | $Q^9$ | $Q^{10}$ | $Q^{11}$ |
|---|---|---|---|---|---|---|---|---|---|---|---|
| M-1 | —$CH_3$ | H | H | H | H | —O— | Z1 | —$CH_3$ | —$CH_3$ | — | — |
| M-2 | —$CH_3$ | —$CH_3$ | —$CH_3$ | H | H | —O— | Z1 | —$CH_3$ | —$CH_3$ | — | — |
| M-3 | —$CH_3$ | —$CH_3$ | —$CH_3$ | H | H | —O— | Z1 | —$C_3H_7$ | —$C_3H_7$ | — | — |
| M-4 | —$C_2H_5$ | H | H | H | H | —O— | Z1 | —$CH_3$ | —$CH_3$ | — | — |
| M-5 | —$C_2H_5$ | —$CH_3$ | —$CH_3$ | H | H | —O— | Z1 | —$CH_3$ | —$CH_3$ | — | — |
| M-6 | —$CH(CH_3)_2$ | —$CH_3$ | —$CH_3$ | H | H | —O— | Z1 | —$CH_3$ | —$CH_3$ | — | — |
| M-7 | —$C_2H_5$ | —$CH_3$ | —$CH_3$ | H | H | —O— | Z1 | —$C_3H_7$ | —$C_3H_7$ | — | — |
| M-8 | —$CH_3$ | —$CH_3$ | —$CH_3$ | H | H | —O— | Z2 | — | — | —$CH_3$ | —$CH_3$ |
| M-9 | —$CH_3$ | H | H | H | H | —$CH_2$— | Z1 | —$CH_3$ | —$CH_3$ | — | — |
| M-10 | —$CH(CH_3)_2$ | H | H | H | H | —$CH_2$— | Z5 | — | — | — | — |
| M-11 | —$C_2H_5$ | H | H | H | H | —$CH_2$— | Z5 | — | — | — | — |

In formulae (Z1) to (Z5), each of $Q^8$ to $Q^9$ independently represents a substituted or unsubstituted monovalent hydrocarbon group with a carbon number of 1 to 12. In the case where these are a substituted hydrocarbon group, examples of the substituent include the same substituents as the substituent in $Q^1$, and preferred embodiments thereof are also the same. In the case where $Q^8$ to $Q^{19}$ are a hydrocarbon group having no substituent, examples thereof include the same embodiments as those of $Q^1$ having no substituent.

In formula (Z1), $Q^8$ and $Q^9$ may be different groups but are preferably the same group. In the case where $Q^8$ and $Q^9$ are an unsubstituted alkyl group, the alkyl group may be linear or branched, and the carbon number thereof is more preferably from 1 to 6.

$Q^8$ and $Q^9$ are preferably both an alkyl group with a carbon number of 1 to 6 in which part of hydrogen atoms As the UV dye (U), among these, in view of solubility in the second transparent resin or host solvent and transparency to visible light, particularly, for the reason that (iii-2) can be satisfied, Dye (M-1), Dye (M-2), Dye (M-5), Dye (M-6), etc. are preferred. Incidentally, the compound (M) can be produced by a common method.

The UV dye (U) may be composed of one kind of a compound or may be composed of two or more kinds of compounds. In the case where the UV dye (U) is composed of two or more kinds of compounds, individual compounds need not have the properties of the UV dye (U) as long as a mixture thereof has the properties of the UV dye (U).

The content of the UV dye (U) in the absorption layer varies depending on the thickness of the absorption layer, but in view of UV shielding property and solubility, it is preferably from 0.01 to 20 parts by mass, more preferably from 0.05 to 20 parts by mass, still more preferably from 0.1 to 20 parts by mass, per 100 parts by mass of the second transparent resin. The absorption layer may contain, in addition to the UV dye (U), another UV dye in the range not impairing the effects of the present invention.

(Second Transparent Resin)

The second transparent resin is a resin having Tg of 170° C. or more. In the case where Tg of the second transparent resin is 170° C. or more, the absorption layer has excellent heat resistance capable of maintaining optical properties of the NIR dye (A) in the use at high temperatures. Furthermore, in a preferred embodiment, deformation due to heat or stress is less likely to occur, and the dielectric multilayer film in the present filter has excellent adhesiveness. Tg is preferably 200° C. or more, more preferably 250° C. or more. The upper limit of Tg is not particularly specified, but in view of forming processability, etc., Tg of the second transparent resin is preferably 400° C. or less.

In addition, the relationship of the second transparent resin with the NIR dye (A) satisfies the requirements of (ii-1) and (ii-2). Preferable ranges in (ii-1) and (ii-2) areas described in the NIR dye (A).

As long as Tg is 170° C. or more and the relationship with the NIR dye (A) satisfies the requirements of (ii-1) and (ii-2), the kind of the second transparent resin is not particularly limited. For example, one or more selected from an acrylic resin, an epoxy resin, an ene-thiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamideimide resin, a polyolefin resin, a polycycloolefin resin, a polyester resin, etc. are used.

As the second transparent resin, the same resins recited as examples of the first transparent resin can be used. Incidentally, since the thickness of the absorption layer is small as compared with the thickness of the resin substrate, a high level of transparency to visible light is not necessarily required in comparison to the first transparent resin. However, the second transparent resin is required to have visible light transparency satisfying the requirements of (ii-1) and (ii-2) in the relationship with the NIR dye (A).

Furthermore, in view of adhesiveness to the dielectric multilayer film, the second transparent resin is preferably a polyimide resin, particularly preferably a polyimide resin (TR-1).

Examples of the commercially available polycarbonate resin that can be used as the second transparent resin include FPC-0220 (trade name, produced by Mitsubishi Gas Chemical Company, Inc.), PURE-ACE (registered trademark) M5 (trade name, produced by Teijin Limited), PURE-ACE (registered trademark) S5 (trade name, produced by Teijin Limited), etc.

Examples of the commercially available polyimide resin that can be used as the second transparent resin include NEOPRIM (registered trademark)C-3650 (trade name, produced by Mitsubishi Gas Chemical Company, Inc.), NEOPRIM (registered trademark)C-3G30 (trade name, produced by Mitsubishi Gas Chemical Company, Inc.), NEOPRIM (registered trademark)C-3450 (trade name, produced by Mitsubishi Gas Chemical Company, Inc.), NEOPRIM (registered trademark) P500 (trade name, produced by Mitsubishi Gas Chemical Company, Inc.), JL-20 (trade name, produced by New Japan Chemical Co., Ltd.), etc., each obtained in a varnish form (in these polyimide resin varnishes, silica may be contained).

From the viewpoint of maintaining high transparency to visible light, the absorption layer is preferably composed of only dyes such as NIR dye (A), UV dye (U), another NIR dye and another UV dye, etc. and the second transparent resin. The content of each dye and the total content of the dyes are as described above.

However, the absorption layer may contain optional components such as adhesion-imparting agent, color tone correcting dye, leveling agent, antistatic agent, heat stabilizer, light stabilizer, antioxidant, dispersing agent, flame retardant, lubricant and plasticizer, etc. in the range not impairing the effects of the present invention.

The absorption layer can be formed, for example, by dissolving or dispersing the NIR dye (A), the second transparent resin or raw material components of the second transparent resin, and a dye other than the NIR dye (A) or various components which are blended if desired, such as the UV dye (U), in a solvent to prepare a coating solution, applying the coating solution onto a substrate, drying it, and furthermore, if desired, curing the coating. The substrate may be a resin substrate included in the present filter or a releasable substrate used only when forming the absorption layer. The solvent is not particularly limited as long as the solvent is a dispersion medium capable of stably dispersing the components or a solvent capable of dissolving the components. For example, in the case of intending to effectively increase the absorption in a wavelength band of 700 nm or more, an NIR dye having a maximum absorption wavelength in a wavelength range of more than 735 nm and 1,200 nm or less, which is described above as another NIR dye, may be added.

In addition, the coating solution may contain a surfactant so as to improve, for example, voids due to microbubbles, dents due to adhesion of foreign materials, cissing in a drying step, etc. Furthermore, in applying the coating solution, for example, a dip coating method, a cast coating method, a die coating method, a spin coating method, etc. can be used. The absorption layer is formed by applying the coating solution onto a substrate and then drying it. Also, in the case where the coating solution contains raw material components of the second transparent resin, a curing treatment such as thermal curing, photocuring, etc. is further performed.

The absorption layer may also be produced in a film form by extrusion, and the film may be stacked on another member, for example, a resin substrate, and integrated by thermocompression bonding.

Assuming that an absorption layer (X) is an absorption layer having the above-described predetermined thickness and containing the NIR dye (A) and the second transparent resin, as for the absorption layer (X), the optical filter may have one layer on one principal surface of the resin substrate 1 as in the optical filter 10A of FIG. 1 or may have a total of two layers, i.e., one layer on each of both principal surfaces of the resin substrate 1, as in the optical filer 10B of FIG. 2. In the case of having two layers as the absorption layer (X), the absorption layers (X) may have the same configuration or different configurations.

As for the first absorption layer 2a and the second absorption layer 2b depicted in the optical filter 10B, a configuration in which one is the absorption layer (X) and the other is another absorption layer may be employed. For example, it may be possible that the first absorption layer 2a is the absorption layer (X) containing the NIR dye (A) and the second transparent layer and the second absorption layer 2b is another absorption layer containing the UV dye (U) and the second transparent resin.

It is preferred that the first absorption layer 2a and the second absorption layer 2b in the optical filter 10B are both composed of an absorption layer (X) containing the NIR dye (A) and the second transparent resin and optionally containing the UV dye (U) and each has a thickness of 5 µm or less. In this case, the second transparent resin in the first absorption layer 2a and the second absorption layer 2b is preferably a polyimide resin, two absorption layers particularly preferably both have a thickness of 1.5 µm or less.

In a spectral transmission curve over a wavelength range of 350 nm to 1,100 nm as measured in a state of an absorption layer-attached resin substrate obtained by disposing an absorption layer on at least one principal surface of a resin substrate, i.e., in a state of a dielectric multilayer film being removed from the present filter, the present filer preferably satisfies the properties of the following (v-1) to (v-4). This allows the present filter to have high transparency to visible light and high shielding property for near-infrared light.

Specifically, the spectral transmittance curve over a wavelength range of 350 nm to 1,100 nm as measured, in the case of the optical filter 10A illustrated in FIG. 1, for a configuration where an absorption layer 2 is stacked on one principal surface of a resin substrate 1, and, in the case of the optical filter 10B illustrated in FIG. 2, for a configuration where a first absorption layer 2a and a second absorption layer 2b are stacked respectively on both principal surfaces of a resin substrate 1, preferably satisfy the properties of the following (v-1) to (v-4). Here, these optical properties are optical properties at an incident angle of 0°.

(v-1) The average internal transmittance in a wavelength range of 435 nm to 480 nm of the optical filter is 90.5% or more. The average internal transmittance is more preferably 91% or more, still more preferably 91.5% or more.

(v-2) The average internal transmittance in a wavelength range of 500 nm to 600 nm of the optical filter is 90.5% or more. The average internal transmittance is more preferably 92% or more, still more preferably 93% or more.

(v-3) The wavelength at which the internal transmittance of the optical filter becomes 20% in a wavelength range of 600 nm to 740 nm is in a wavelength range of 650 nm to 685 nm.

(v-4) The average internal transmittance in a wavelength range of 700 nm to 730 nm of the optical filter is 3% or less. The average internal transmittance is more preferably 2% or less, still more preferably 1% or less.

[Dielectric Multilayer Film]

As illustrated in the optical filter 10A of FIG. 1 and the optical filter 10B of FIG. 2, in the present filter, the principal surfaces on both sides are composed of a dielectric multilayer film. In the present filter, at least one dielectric multilayer film is designed as an NIR reflection layer. In a preferred embodiment of the present filter, the resin substrate and the absorption layer have the above-described configurations, and this makes it difficult to cause deformation due to heat or stress, as a result, separation of the dielectric multilayer film from the resin substrate or absorption layer is sufficiently inhibited.

The NIR reflection layer is a dielectric multilayer film designed to shield light in the near-infrared region. The NIR reflection layer has wavelength selectivity of, for example, transmitting visible light and reflecting mainly light in the near-infrared region except for the light blocking region of the absorption layer. The reflection region of the NIR reflection layer may include a light blocking region in the near-infrared region of the absorption layer. The property of the NIR reflection layer is not limited to the NIR reflection properties and the NIR reflection layer may be appropriately designed to a configuration in which light in a wavelength region except for the near-infrared region, for example, in a near-ultraviolet region, is further blocked.

In the present filter, the absorption layer and the NIR reflection layer preferably have the following relationships. In the absorption layer, the shorter wavelength-side wavelength $\lambda_{ABIRSHT20\text{-}0°}$ of the wavelength at which the transmittance in the absorption range of the near-infrared region for light at an incident angle of 0° becomes 20% is preferably present in a wavelength range of 650 nm to 720 nm. Also, the relationship of $\lambda_{ABIRSHT20\text{-}0°}$ with the shorter wavelength-side wavelength $\lambda_{REIRSHT20\text{-}0°}$ at which the transmittance in the reflection range of the near-infrared region for light at an incident angle of 0° becomes 20% in the NIR reflection layer preferably satisfies (iv-1):

(iv-1) $\lambda_{ABIRSHT20\text{-}0°} + 30 \text{ nm} \leq \lambda_{REIRSHT20\text{-}0°} \leq 790$ nm The NIR reflection layer preferably further satisfies (iv-2).

(iv-2) The average transmittance of the NIR reflection layer for light in a wavelength range from $\lambda_{REIRSHT20\text{-}0°}$ to $\lambda_{RERSHT20\text{-}0°} + 300$ nm is 10% or less.

In the present filter, since the absorption layer contains the NIR dye (A), the incident angle dependence of the NIR reflection layer for light incident at a high angle on the NIR reflection layer can be reduced. Among others, the incident angle dependence of the NIR reflection layer at the boundary between visible light region and near-infrared region can be reduced.

In the case where the present filter is designed to a configuration where the absorption layer further contains the UV dye (U) and the NIR reflection layer further blocks light in a near-ultraviolet range, the absorption layer and the NIR reflection layer preferably have the following relationship.

In the absorption layer, the longer wavelength-side wavelength $\lambda_{ABUVL20\text{-}0°}$ at which the transmittance in the absorption range of the near-ultraviolet region for light at an incident angle of 0° becomes 20% is preferably in a wavelength range of 395 nm to 420 nm. Also, the longer wavelength-side wavelength $\lambda_{REUVLO20\text{-}0°}$ at which the transmittance in the reflection range of the near-ultraviolet region for light at an incident angle of 0° becomes 20% in the NIR reflection region is preferably in a wavelength range of 390 nm to 420 nm.

The NIR reflection layer is composed of a dielectric multilayer film formed by alternately stacking low-refractive index dielectric films (low-refractive index films) and high-refractive index dielectric films (high-refractive index films). The high-refractive index film preferably has a refractive index of 1.6 or more, more preferably from 2.2 to 2.5. Examples of the material of the high-refractive index film include $Ta_2O_5$, $TiO_2$, and $Nb_2O_5$. Among these, $TiO_2$ is preferred in view of reproducibility in film formability, refractive index and so on, stability, etc.

On the other hand, the low-refractive index film preferably has a refractive index of less than 1.6, more preferably 1.45 or more and less than 1.55. Examples of the material of the low-refractive index film include $SiO_2$ and $SiO_xN_y$. In view of reproducibility in terms of film formability, stability, profitability, etc., $SiO_2$ is preferred.

Furthermore, in the NIR reflection layer, it is preferred that the transmittance steeply changes in a boundary wavelength range between the transmission region and the light blocking region. For this purpose, the total number of stacks of the dielectric multilayer film constituting the NIR reflection layer is preferably 15 or more, more preferably 25 or more, still more preferably 30 or more. However, if the total number of stacks is large, warping, etc. may occur, and the film thickness may increase. Accordingly, the total number of stacks is preferably 100 or less, more preferably 75 or less, still more preferably 60 or less. In addition, the thickness of the dielectric multilayer film is preferably from 2 m to 10 μm.

In the case where the total number of stacks and thickness of the dielectric multilayer film are in the ranges above, the NIR reflection layer can satisfy the miniaturization requirement and be reduced in the incident angle dependence while maintaining high productivity. In addition, for the formation of the dielectric multilayer film, for example, a vacuum film-forming process such as CVD method, sputtering method and vacuum deposition method, or a wet film-forming process such as spray method and dip method can be used.

The NIR reflection layer may provide predetermined optical properties in a single layer (a group of dielectric multilayer films) or may provide predetermined optical properties in combination of two layers. Taking the optical filter 10A illustrated in FIG. 1 for example to illustrate, in the first dielectric multilayer film 3a and the second dielectric multilayer film 3b included in the optical filter 10A, when one is the NIR reflection layer, the other is an NIR reflection layer, a reflection layer having a reflection region except for the near-infrared region, or an antireflection layer.

Also, in the case where the first dielectric multilayer film 3a or the second dielectric multilayer film 3b is a reflection layer having a reflection region except for the near-infrared region or an antireflection layer, as with the above-described NIR reflection layer, the dielectric multilayer film is appropriately designed and formed so that the structure in which a low-refractive index film and a high-refractive index film are alternately stacked can provide the desired reflection properties.

In the case where both the first dielectric multilayer film 3a and the second dielectric multilayer film 3b are an NIR reflection layer, each of NIR reflection layers may have the same configuration or different configurations. In the case of providing two layers as the NIR reflection layer, two layers are usually configured to differ in the reflection band.

In the case of providing two layers as the NIR reflection layer, it may be possible, for example, to form one layer as an NIR reflection layer for shielding light in the shorter wavelength band out of the near-infrared region and form the other layer as an NIR reflection layer for shielding light in both ranges of the longer wavelength band of the near-infrared region and the near-ultraviolet region.

The present filter may include, as other constituent elements, for example, a constituent element (layer) giving absorption by inorganic fine particles, etc. which control transmission and absorption of light in a specific wavelength region. Specific examples of the inorganic fine particle include ITO (Indium Tin Oxides), ATO (Antimony-doped Tin Oxides), cesium tungstate, and lanthanum boride. The ITO fine particles and cesium tungstate fine particles have high visible light transmittance and a wide range of light absorbing property in the infrared wavelength range exceeding 1,200 nm and therefore, can be used in the case where a shielding property for such infrared light is required.

The present filter is an optical filter having high transparency to visible light and high shielding property for near-infrared light and having excellent heat resistance of the optical properties. Furthermore, in a preferred embodiment, the present filter is an optical filter having high adhesiveness of the dielectric multilayer film to a substrate or absorption layer using a resin material.

The present filter preferably satisfies, in terms of optical properties, specifically, the requirements of the following (I-1) to (I-5).

(I-1) In the optical filter, at an incident angle of 0°, the average transmittance $T_{435\text{-}480ave0}$ of light in a wavelength range of 435 nm to 480 nm is 86% or more and the average transmittance $T_{500\text{-}600ave0}$ of light in a wavelength range of 500 nm o 600 nm is 89% or more.

(I-2) In the optical filter, at an incident angle of 30°, the average transmittance $T_{435\text{-}480av30}$ of light in a wavelength range of 435 nm to 480 nm is 85% or more and the average transmittance $T_{500\text{-}600ave30}$ of light in a wavelength range of 500 nm to 600 nm is 89% or more.

(I-3) In the optical filter, the absolute value $\Delta T_{380\text{-}425ave0\text{-}30}$ of the difference between the average transmittance in a range of 380 nm to 425 nm at an incident angle of 0° and the average transmittance in a range of 380 nm to 425 nm at an incident angle of 30° is 3% or less.

(I-4) In the optical filter, the absolute value $\Delta T_{615\text{-}725ave0\text{-}30}$ of the difference between the average transmittance in a range of 615 nm to 725 nm at an incident angle of 0° and the average transmittance in a range of 615 nm to 725 nm at an incident angle of 30° is 3% or less.

(I-5) In the optical filter, in the transmittance of light at an incident angle of 0°, a wavelength at which the transmittance becomes 20% is present in a wavelength range of 650 nm to 685 nm.

In the case where (I-1) and (I-2) are satisfied, the present filter can have high transparency to visible light regardless of the incident angle. In (I-1), $T_{435\text{-}480ave0}$ is more preferably 87% or more, and $T_{500\text{-}600ave0}$ is more preferably 90% or more, still more preferably 92% or more. In (I-2), $T_{435\text{-}480ave30}$ is more preferably 87% or more, and $T_{500\text{-}600ave30}$ is more preferably 90% or more, still more preferably 91% or more.

In the case where (I-3) and (I-4) are satisfied, the present filter can exhibit a small change between when light is vertically incident and when obliquely incident at both the boundary between visible region and near-ultraviolet region and the boundary between visible region and near-infrared region. In (I-3), $\Delta T_{380\text{-}425ave0\text{-}30}$ is more preferably 2.5% or less, and in (I-4), $\Delta T_{615\text{-}725ave0\text{-}30}$ is more preferably 2.5% or less.

In the case where (I-5) is satisfied, the present filter can largely transmit visible light and effectively block near-infrared light in a wavelength range of 700 nm or more. In the transmittance of light at an incident angle of 0°, the wavelength range where a wavelength at which the transmittance becomes 20% is present is more preferably from 650 nm to 680 nm.

In addition to these, from the viewpoint of preventing crosstalk of laser light having a wavelength used for iris recognition or face recognition, the present filter preferably satisfies the requirement of the following (I-6).

(I-6) In the optical filter, the maximum transmittance in a range of 800 nm to 1,000 nm at an incident angle of 0° is 1% or less. The maximum transmittance is more preferably 0.5% or less, still more preferably 0.1%.

In the case where the present filter is used, for example, for an imaging device such as digital still camera, an imaging device having excellent color reproducibility and having excellent heat resistance of the color reproducibility can be provided. Also, in the present filter of a preferred embodiment, the separation of the dielectric multilayer film is inhibited, so that an imaging device having excellent durability can be provided. An imaging device using the present filter includes a solid-state image sensing device, an imaging lens, and the present filter. The present filter can be used, for example, by disposing the present filter between the imaging lens and the solid-state image sensing device or by directly attaching the present filter to the solid-state image sensing device, imaging lens, etc. of the imaging device via an adhesive layer.

EXAMPLES

The present invention is more specifically described below by referring to Examples. In the following measurement of each optical property, an ultraviolet-visible spectrophotometer (Model U-4100, manufactured by Hitachi High Technologies Co., Ltd.) was used.

[Evaluation of Transparent Resin for Resin Substrate]

Using commercially available resin films shown in Table 7, spectral transmittance curves and spectral reflectance curves over a wavelength range of 350 nm to 1,100 nm at an incident angle of 5° were obtained. Based on the obtained transmittances and reflectances, an average internal transmittance $T_{350\text{-}450ave(TR)}$ in a wavelength range of 350 nm to 450 nm and a minimum internal transmittance $T_{400\text{-}450min(TR)}$ in a wavelength range of 400 nm to 450 nm, which are calculated in terms of a thickness of 100 μm, were determined. Furthermore, a wavelength $\lambda_{UV90}$ at which the internal transmittance becomes 90% in a wavelength range of 500 nm or less was determined.

The results are shown in Table 7 together with the trade name, thickness, kind of resin, manufacturer, and Tg of each resin film. In Table 7, NEOPRIM, PURE-ACE, Teonex, ZeonorFilm are registered trademarks. In the following description, only symbols are presented by omitting trademarks. "M5-80" and "S5-100" indicate an 80 μm-thick film of PURE-ACE (registered trademark) M5 and a 100 km-thick film of PURE-ACE (registered trademark) S5, respectively. In the following, "M5-80" has the same meaning. As for kinds of the resin, the following abbreviations were used. PI is a polyimide resin, PC is a polycarbonate resin, PET is a polyethylene terephthalate resin, PEN is a polyethylene naphthalate resin, and COP is a polycycloolefin resin.

It is seen from Table 7 that the polyimide resin L-3G30 and the polycarbonate resins M5-80 and S5-100 are applicable as the first transparent resin in the resin substrate of the present filter.

[Fabrication and Evaluation of Absorption Layer]

An absorption layer was fabricated using the following dyes and transparent resin and evaluated for the optical properties and physical properties to judge whether or not the dye and transparent resin are applicable as the NMRdye (A), UV dye (U) and second transparent resin.

(Dye)

As the NIR dye (A), Dye (I-11-7), Dye (I-11-20), Dye (I-12-15) and Dye (I-12-25) were synthesized in a common manner. As another NIR dye, Dye (2) was synthesized by the method described in International Publication WO2017/104283. As the UV dye (U), Dye (M-6) was synthesized in a common manner.

In addition, as the dye for Comparative Examples, FDN023 and FDN026 (both produced by Yamada Kagaku Co., Ltd., phthalocyanine dyes) were prepared.

(Transparent Resin)

As the resin for forming the absorption layer, the following commercial products were prepared. Among the following transparent resins, the resin satisfying the requirement of Tg in the second transparent resin is only C-3G30.

NEOPRIM (registered trademark)C-3G30 (produced by Mitsubishi Gas Chemical Company, Inc., trade name, hereinafter referred to as "C-3G30"), a varnish containing a polyimide resin, Tg of the polyimide resin contained: 320° C.

OKP-850 (produced by Osaka Gas Chemicals Co., Ltd., trade name), a polyethylene terephthalate resin, Tg: 150° C.

FPC-0220 (produced by Mitsubishi Gas Chemical Company, Inc., trade name), a polycarbonate resin, Tg: 186° C.

TABLE 7

| Trade Name | Thickness [μm] | Kind of Resin | Manufacturer | Tg [° C.] | $T_{350\text{-}450ave(TR)}$ [%] | $T_{400\text{-}450min(TR)}$ [%] | $\lambda_{uv}90$ [nm] |
|---|---|---|---|---|---|---|---|
| NEOPRIM L-3G30 | 50 | PI | Mitsubishi Gas Chemical | 320 | 100 | 99.7 | 317 |
| PURE-ACE C110 | 100 | PC | Teijin | 155 | 99.4 | 99.0 | 300 or less |
| PURE-ACE M5-80 | 80 | PC | Teijin | 215 | 99.4 | 99.2 | 328 |
| PURE-ACE S5-100 | 100 | PC | Teijin | 225 | 98.9 | 99.0 | 330 |
| NEOPRIM L-3450 | 50 | PI | Mitsubishi Gas Chemical | 303 | 94.1 | 95.4 | 360 |
| OKP-F2 | 100 | PE | Osaka Gas Chemicals | 142 | 95.3 | 98.6 | 362 |
| OKP-F5 | 100 | PE | Osaka Gas Chemicals | 150 | 72.0 | 97.6 | 385 |
| Teonex Q65HA | 100 | PEN | Teijin | 151 | 61.2 | 90.6 | 399 |
| ZeonorFilm ZF-16 | 100 | COP | Zeon | 163 | 100 | 100 | 300 or less |

(Evaluation)
(1) Optical Properties in Dichloromethane

Dye (I-11-20) was dissolved in dichloromethane (in the Table, denoted by "DCM"), and a spectral transmittance curve over a wavelength range of 350 nm to 1,100 nm was measured. A maximum absorption wavelength (in Table, denoted by "$\lambda_{max}$") in a wavelength range of 400 nm to 800 nm was determined and, the average transmittance in a wavelength range of 435 nm to 500 nm (in Table, denoted by "$T_{435\text{-}500ave}$") and the average transmittance in a wavelength range of 500 nm to 600 nm (in Table, denoted by "$T_{500\text{-}600ave}$") measured by incorporating the dye such that the transmittance at the maximum absorption wavelength became 1% were determined. The results are shown in Table 8.

(2) Optical Properties in Transparent Resin

Dye (I-11-20) was dissolved in a transparent resin shown in Table 8 and cyclohexanone to obtain a coating solution. The obtained coating solution was applied onto a glass plate (D263; manufactured by SCHOTT) and dried to obtain an absorption layer. A spectral transmittance curve of the absorption layer-attached glass plate over a wavelength range of 350 nm to 1,100 nm and a spectral transmittance curve of the glass plate were measured, and using these curves, a spectral transmittance curve of the absorption layer was obtained.

From the obtained spectral transmittance curve, the maximum absorption wavelength in a wavelength range of 400 nm to 800 nm and, the average internal transmittance of light in a wavelength region of 435 nm to 500 nm and the average internal transmittance of light in a wavelength range of 500 nm to 600 nm, both of which were measured in the case where the internal transmittance of light at the maximum absorption wavelength was 1%, were determined. The results are shown in Table 8 together with the film thickness of the absorption layer and the dye concentration. The dye concentration in Table 8 is parts by mass per 100 parts by mass of the transparent resin when the concentration was adjusted such that the internal transmittance of light at the maximum absorption wavelength above becomes 1%.

(3) Heat Resistance

The heat resistance test was a test where an absorption layer-attached glass plate manufactured in the same manner as in (2) above is heated at 160° C. for 3 hours. Before and after the heat resistance test, the internal transmittance of the absorption layer was measured in the same manner as in (2) above. In the evaluation of heat resistance, the percentage (%) of the absorption coefficient before and after the heat resistance test at a wavelength of 680 nm was estimated as the residual rate (%) of the dye according to the following formula. In Table 8, the results are shown together with the film thickness of the absorption layer and the dye concentration (parts by mass per 100 parts by mass of the transparent resin; as for C-3G30, parts by mass per 100 parts by mass of the transparent resin in the varnish).

Residual rate (%)=(absorption coefficient ($\varepsilon$) at 680 nm after heat resistance test)/(initial absorption coefficient ($\varepsilon$) at 680 nm)×100

(4) Adhesiveness

A sample for an adhesiveness test was manufactured by depositing a dielectric multilayer film (a multilayer film with a thickness of 3.25 m in which $SiO_2$ and $TiO_2$ are alternately stacked from the absorption layer side) as an antireflection layer on the absorption layer of an absorption layer-attached glass plate manufactured in the same manner as in (2) above. A cellophane tape was attached to the top of the antireflection layer of the sample, and the adhesiveness was evaluated by the cross-cut method (JIS K5600). When out of 100 squares of a cross-cut pattern, the number of squares detached is 5 or less, the rating was "A", and when it is 6 or more, the rating was "C". The results are shown in Table 8. The film thickness of the absorption layer and the dye concentration (parts by mass per 100 parts by mass of the transparent resin) were the same as in the heat resistance test and are shown in Table 8 as common items.

TABLE 8

| Dye (I-11-20) DCM, Transparent Resin | | DCM | C-3G30 | OKP-850 |
|---|---|---|---|---|
| Tg of Transparent resin [° C.] | | — | 320 | 150 |
| Optical properties | Dye concentration [parts by mass] | — | 8.0 | 4.4 |
| | Film thickness [µm] | — | 0.9 | 1.7 |
| | $T_{435\text{-}500ave}$ [%] | 97.8 | 96.1 | 94.4 |
| | $T_{500\text{-}600ave}$ [%] | 97.9 | 94.8 | 97.6 |
| | $\lambda_{max}$ [nm] | 711 | 714 | 723 |
| Physical properties | Dye concentration [parts by mass] | | 6 | 2 |
| | Film thickness [µm] | | 0.9 | 1.7 |
| | Heat resistance | | 96% | 90% |
| | Adhesiveness | | A | A |

The results of Dye (I-12-15) evaluated in the same manner as above are shown in Table 9, and the results of Dye (I-11-7) are shown in Table 10.

TABLE 9

| Dye (I-12-15) DCM, Transparent Resin | | DCM | C-3G30 | OKP-850 |
|---|---|---|---|---|
| Tg of Transparent resin [° C.] | | — | 320 | 150 |
| Optical properties | Dye concentration [parts by mass] | — | 7.7 | 4.3 |
| | Film thickness [µm] | — | 0.9 | 1.7 |
| | $T_{435\text{-}500ave}$ [%] | 97.7 | 96.4 | 95.2 |
| | $T_{500\text{-}600ave}$ [%] | 97.1 | 96.5 | 96.8 |
| | $\lambda_{max}$ [nm] | 698 | 706 | 706 |
| Physical properties | Dye concentration [parts by mass] | | 6.5 | 2 |
| | Film thickness [µm] | | 0.9 | 1.7 |
| | Heat resistance | | 97% | 94% |
| | Adhesiveness | | A | A |

TABLE 10

| Dye (I-11-7) DCM, Transparent Resin | | DCM | C-3G30 | FPC-0220 |
|---|---|---|---|---|
| Tg of Transparent resin [° C.] | | — | 320 | 186 |
| Optical properties | Dye concentration [parts by mass] | — | 7.1 | 2.3 |
| | Film thickness [µm] | — | 0.9 | 2.0 |
| | $T_{435\text{-}500ave}$ [%] | 97.8 | 94.9 | 96.3 |
| | $T_{500\text{-}600ave}$ [%] | 97.9 | 97.3 | 98.4 |
| | $\lambda_{max}$ [nm] | 711 | 715 | 712 |
| Physical properties | Dye concentration [parts by mass] | | 6 | 2 |
| | Film thickness [µm] | | 0.9 | 2.0 |
| | Heat resistance | | 97% | 97% |
| | Adhesiveness | | A | C |

Furthermore, with respect to Dye (M-6) that is a UV dye (U), optical properties were evaluated in the same manner as above. The results are shown in Table 11. In addition, with respect to FDN023 and FDN026, spectral properties in dichloromethane and spectral properties in C-3G30 are shown in Table 12 and Table 13, respectively.

TABLE 11

| Dye (M-6) DCM, Transparent Resin | | DCM | C-3G30 | FPC-0220 |
|---|---|---|---|---|
| Tg of Transparent resin [° C.] | | — | 320 | 175 |
| Optical properties | Dye concentration [parts by mass] | — | 7.0 | 3.6 |
| | Film thickness [μm] | — | 0.9 | 2.0 |
| | $T_{435\text{-}500ave}$ [%] | 98.6 | 99.4 | 99.0 |
| | $T_{500\text{-}600ave}$ [%] | 98.8 | 99.7 | 99.8 |
| | $\lambda_{max}$ [nm] | 399 | 400 | 403 |

TABLE 12

| FDN023 DCM, Transparent Resin | | DCM | C-3G30 |
|---|---|---|---|
| Tg of Transparent resin [° C.] | | — | 320 |
| Optical properties | Dye concentration [parts by mass] | — | 11.8 |
| | Film thickness [μm] | — | 2.1 |
| | $T_{435\text{-}500ave}$ [%] | 92.8 | 82.7 |
| | $T_{500\text{-}600ave}$ [%] | 97.5 | 94.2 |
| | $\lambda_{max}$ [nm] | 726 | 732 |

TABLE 13

| FDN026 DCM, Transparent Resin | | DCM | C-3G30 |
|---|---|---|---|
| Tg of Transparent resin [° C.] | | — | 320 |
| Optical properties | Dye concentration [parts by mass] | — | 5.2 |
| | Film thickness [μm] | — | 2.1 |
| | $T_{435\text{-}500ave}$ [%] | 95.4 | 91.9 |
| | $T_{500\text{-}600ave}$ [%] | 97.9 | 96.3 |
| | $\lambda_{max}$ [nm] | 731 | 736 |

[Fabrication and Evaluation of Optical Filter]

Ex. 1

An optical filter having the same configuration as the optical filter 10B illustrated in FIG. 2 was produced and evaluated as follows.

As the resin substrate, M5-80 having physical properties shown in Table 7, which is a polycarbonate resin film, was used. As the second transparent resin, C-3G30 (resin varnish) was used, and 9.6 parts by mass of Dye (I-12-15) and 2.7 parts by mass of Dye (M-6) were added per 100 parts by mass of the transparent resin in the varnish to prepare a coating solution by using cyclohexanone as a host solvent. The obtained coating solution was applied onto both principal surfaces of M5-80 by a die coating method and dried to form an absorption layer with a film thickness of 0.6 μm on each principal surface.

On one absorption layer on the resin substrate, a reflection layer which is composed of a dielectric multilayer film with a thickness of 6.7 m obtained by alternately stacking a $TiO_2$ film and an $SiO_2$ film by vapor deposition and in which a relationship shown in Table 14 exists between the incident angle and the transmittance in each wavelength region, was formed as an NIR reflection layer. In Table 14, $R_{420\text{-}650}$ indicates the maximum reflectance [%] of light in a wavelength range of 420 nm to 650 nm for light at each incident angle in Table 14. $\lambda_{REIRSHT20}$ indicates the shorter wavelength-side wavelength at which in the reflection layer, the transmittance for light at each incident angle in Table 14 becomes 20% on the near-infrared region side, and $\lambda_{RESUVLO20}$ indicates the longer wavelength-side wavelength at which in the reflection layer, the transmittance for light at each incident angle in Table 14 becomes 20% in a range of 350 nm to 500 nm.

TABLE 14

| Evaluation Item/Incident Angle (deg) | 0 | 30 |
|---|---|---|
| $R_{420\text{-}650}$ (%) | 0.7 | 2.5 |
| $\lambda_{REIRSHT20}$ (nm) | 716 | 688 |
| $\lambda_{RESUVLO20}$ (nm) | 405 | 394 |

On the other absorption layer on the resin substrate, a dielectric multilayer film with a thickness of 3.0 μm formed by alternately stacking a $TiO_2$ film and an $SiO_2$ film by vapor deposition was deposited as an antireflection layer.

(Evaluation)

(1) Optical Properties

Figure 3:
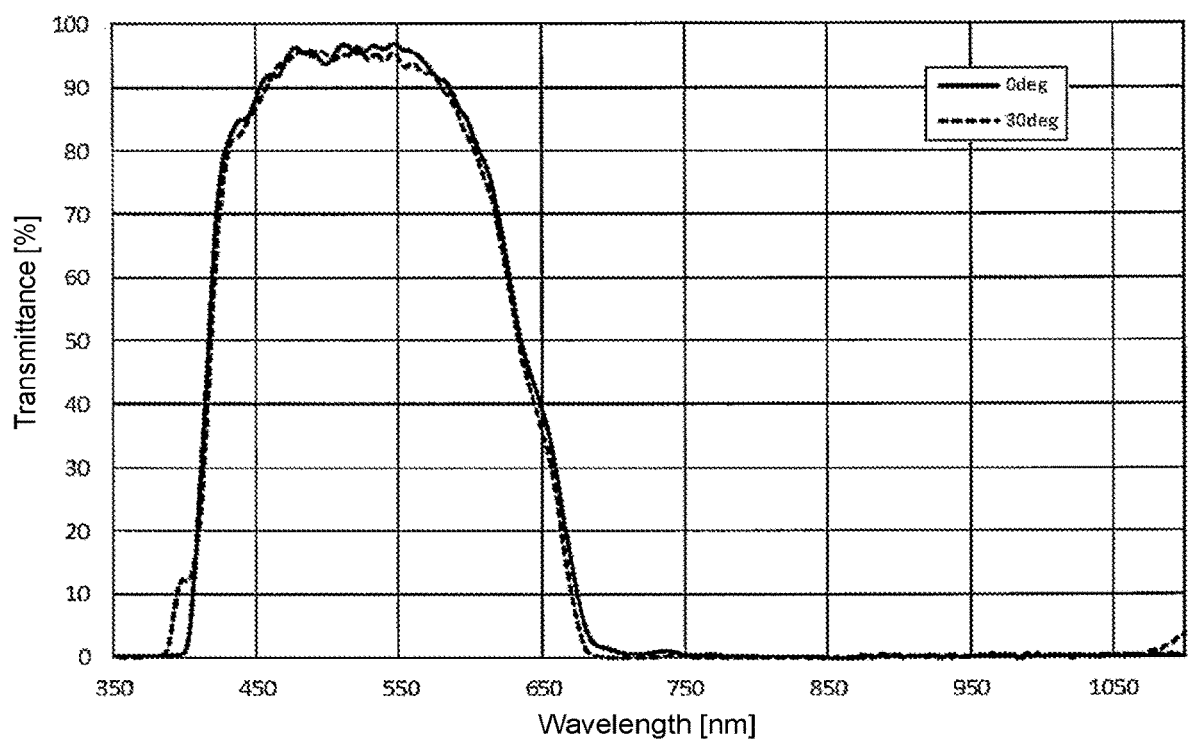
FIG. 3 is a diagram illustrating a spectral transmittance curve of the optical filter of Example.

Spectral transmittance curves of the obtained optical filter over a wavelength range of 350 nm to 1,100 nm at an incident angle of 0° and an incident angle of 30° are shown in FIG. 3. The following optical properties were evaluated using these spectral transmittance curves. The results are shown in Table 15.

(a) The average transmittance (in the Table, denoted by "$T_{435\text{-}480ave}$") of light in a wavelength range of 435 nm to 480 nm and the average transmittance (in the Table, denoted by "$T_{500\text{-}600ave}$") of light in a wavelength range of 500 nm to 600 nm, each at incident angles of 0° and 30°.

(b) The absolute value (in the Table denoted by "$\Delta T_{380\text{-}425}$") of the difference between the average transmittance in a range of 380 nm to 425 nm at an incident angle of 0° and the average transmittance in a range of 380 nm to 425 nm at an incident angle of 30°.

(c) The absolute value (in the Table, denoted by "$\Delta T_{615\text{-}725}$") of the difference between the average transmittance in a range of 615 nm to 725 nm at an incident angle of 0° and the average transmittance in a range of 615 nm to 725 nm at an incident angle of 30°.

(d) The wavelength (in the Table, denoted by "$\lambda_{20}$") where a wavelength at which the transmittance becomes 20% on the longer wavelength side of the visible region in the transmittance of light at an incident angle of 0° is present.

TABLE 15

| Evaluation Item | | Ex. 1 |
|---|---|---|
| 0 deg | $T_{435\text{-}480ave}$ [%] | 90.3 |
| | $T_{500\text{-}600ave}$ [%] | 93.7 |
| 30 deg | $T_{435\text{-}480ave}$ [%] | 89.6 |
| | $T_{500\text{-}600ave}$ [%] | 92.6 |
| $\Delta T_{380\text{-}425}$ [%] | | 0.8 |
| $\Delta T_{615\text{-}725}$ [%] | | 2.3 |
| $\lambda_{20}$ [nm] | | 673 |

(2) Heat Resistance

A heating test of allowing the obtained optical filter to stand in an atmosphere at 160° C. for 30 minutes was performed. As a result, cracking due to the heating test was not caused.

(3) Adhesiveness

A peel test of immersing the obtained optical filter in warm water at 80° C. for 30 minutes was conducted. As a result, the NIR reflection layer and the antireflection layer were not separated from the optical filter after the peel test. It is understood that the NIR reflection layer and the antireflection layer are firmly adhered to the NIR absorption layer.

Exs. 2 to 9

Optical filters having the same configuration as the optical filter 10B illustrated in FIG. 2 were produced and evaluated as follows. As the resin substrate, M5-80 (thickness: 80 μm), L-3G30 (thickness: 50 μm), S5-100 (thickness: 100 μm), L-3450 (thickness: 50 μm), OKP-F5 (thickness: 100 m), and Q65HA (thickness: 100 μm), each having physical properties shown in Table 7, were used. As the second transparent resin, C-3G30 (resin varnish) was used, and each of Dye (I-12-15), Dye (I-12-25), Dye (M-6), and Dye (2) was added in a blending amount shown in Table 16 and Table 17 per 100 parts by mass of the transparent resin in the varnish to prepare a coating solution using cyclohexanone as a host solvent. The obtained coating solution was applied onto both principal surfaces of each resin substrate by a die coating method and dried to form an absorption layer with a film thickness of 0.55 μm or 0.9 m on each principal surface.

With respect to the obtained absorption layer-attached resin substrate, optical properties according to (v-1) to (v-4) above in a spectral transmittance curve over a wavelength range of 350 nm to 1,100 nm were evaluated. Here, the optical properties are optical properties at an incident angle of 0°.

More specifically, in a spectral transmittance curve over a wavelength range of 350 nm to 1,100 nm, the average internal transmittance (referred to as "$T_{435-480ave-x}$") in a wavelength range of 435 nm to 480 nm, the average internal transmittance (referred to as "$T_{500-600ave-x}$") in a wavelength range of 500 nm to 600 nm, the wavelength (referred to as "$\lambda_{IR20}$") at which the internal transmittance becomes 20% in a wavelength range of 600 nm to 740 nm, and the average internal transmittance (referred to as "$T_{700-730ave-x}$") in a wavelength range of 700 nm to 730 nm were evaluated. The results are shown in Table 16. In Table 16, absorption layer-attached resin substrates corresponding to optical filters of Ex. 2 to Ex. 9 manufactured as follows are presented in Ex. 2 to Ex. 9.

TABLE 16

| Configuration•Evaluation Items | | | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| Resin substrate | Trade name | | M5-80 | L-3G30 | S5-100 | L-3450 | OKP-F5 | Q65HA | M5-80 | M5-80 |
| | Thickness [μm] | | 80 | 50 | 100 | 50 | 100 | 100 | 80 | 80 |
| Absorption layer | Transparent resin | | | | | | C-3G30 | | | |
| | NIR Dye (A) | I-12-15 | | | | 10.6 | | | — | — |
| | [parts by mass] | I-12-25 | | | | — | | | 6.8 | 4.6 |
| | UV Dye | M-6 | | | | 4.5 | | | 2.5 | 2.5 |
| | [parts by mass] | | | | | | | | | |
| | Another NIR dye | 2 | | | | — | | | | 0.75 |
| | [parts by mass] | | | | | | | | | |
| | Thickness [μm], arrangement position | | Absorption layers with a thickness of 0.55 μm were disposed on both surfaces. | | | | | | Absorption layers with a thickness of 0.9 μm were disposed on both surfaces. | |
| $T_{435-480ave-X}$ [%] | | | 91.3 | 91.8 | 91.0 | 90.3 | 90.3 | 89.2 | 91.3 | 91.1 |
| $T_{500-600ave-X}$ [%] | | | 93.7 | 94.3 | 93.6 | 93.2 | 93.1 | 93.4 | 93.5 | 90.6 |
| $\lambda_{IR20}$ [nm] | | | 659 | 659 | 659 | 659 | 659 | 659 | 658 | 665 |
| $T_{700-730ave-X}$ [%] | | | 0.6 | 0.6 | 0.6 | 0.6 | 0.6 | 0.6 | 0.53 | 0.017 |

Using the absorption layer-attached resin substrate obtained above, an NIR reflection layer and an antireflection layer were deposited in the same manner as in Ex. 1 on one absorption layer and the other absorption layer, respectively, on the resin substrate to manufacture optical filters of Ex. 2 to Ex. 9. With respect to the obtained optical filters, the same optical properties as in Ex. 1 were evaluated. The results are shown in Table 17.

TABLE 17

| Configuration•Evaluation Items | | | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| Resin substrate | Trade name | | M5-80 | L-3G30 | S5-100 | L-3450 | OKP-F5 | Q65HA | M5-80 | M5-80 |
| | Thickness [μm] | | 80 | 50 | 100 | 50 | 100 | 100 | 80 | 80 |
| Absorption layer | Transparent resin | | | | | | C-3G30 | | | |
| | NIR Dye (A) | I-12-15 | | | | 10.6 | | | — | — |
| | [parts by mass] | I-12-25 | | | | — | | | 6.8 | 4.6 |
| | UV Dye | M-6 | | | | 4.5 | | | 2.5 | 2.5 |
| | [parts by mass] | | | | | | | | | |
| | Another NIR dye | 2 | | | | — | | | | 0.75 |
| | [parts by mass] | | | | | | | | | |
| | Thickness [μm], arrangement position | | Absorption layers with a thickness of 0.55 μm were disposed on both surfaces. | | | | | | Absorption layers with a thickness of 0.9 μm were disposed on both surfaces. | |

TABLE 17-continued

| Configuration•Evaluation Items | | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Configuration of dielectric multilayer film | | \multicolumn{8}{l}{The NIR reflection layer of Table 14 on one absorption layer and an antireflection layer on the other absorption layer.} |
| 0 deg | $T_{435\text{-}480ave\text{-}X}$ [%] | 86.5 | 87.0 | 86.2 | 85.6 | 85.5 | 84.5 | 87.5 | 88.6 |
| | $T_{500\text{-}600ave\text{-}X}$ [%] | 90.6 | 91.2 | 90.4 | 90.1 | 90.0 | 90.3 | 90.0 | 89.9 |
| 30 deg | $T_{435\text{-}480ave\text{-}X}$ [%] | 85.8 | 86.3 | 85.5 | 84.9 | 84.8 | 83.8 | 85.9 | 87.0 |
| | $T_{500\text{-}600ave\text{-}X}$ [%] | 89.5 | 90.1 | 89.4 | 89.1 | 89.0 | 89.2 | 88.9 | 88.8 |
| | $\Delta T_{380\text{-}425}$ [%] | 1.2 | 1.2 | 1.2 | 1.2 | 1.2 | 1.1 | 0.3 | 0.3 |
| | $\Delta T_{615\text{-}725}$ [%] | 1.4 | 1.4 | 1.4 | 1.4 | 1.4 | 1.4 | 0.8 | 1.6 |
| | $\lambda_{20}$ [nm] | 658 | 658 | 658 | 658 | 658 | 658 | 658 | 668 |

As apparent from the test results above, optical filters of Ex. 1 to Ex. 4, Ex. 8 and Ex. 9, which are optical filters of Examples satisfying the requirements of the present invention, have high transparency to visible light and high shielding property for near-infrared light, in which the shift at oblique incidence is inhibited, and furthermore, which are excellent in heat resistance and adhesiveness of the dielectric multilayer film. On the other hand, in optical filters of Ex. 5 to 7, which are Comparative Examples, it is seen that due to large absorption in the visible range of the resin substrate, among others, $T_{43\text{-}480ave}$ indicative of the transparency to blue visible light is low at incident angles of 0° and 30°.

While the invention has been described in detail and with reference to specific embodiments thereof, it will be apparent to one skilled in the art that various changes and modifications can be made therein without departing from the spirit and scope of the invention. This application is based on Japanese Patent Application (Patent Application No. 2018-170906) filed on Sep. 12, 2018, the contents of which are incorporated herein by way of reference.

INDUSTRIAL APPLICABILITY

The optical filter of the present invention has, in a near-infrared cut filter using a resin material as the substrate, high transparency to visible light and high shielding property for near-infrared light as well as excellent heat resistance of these optical properties and therefore, is useful for applications where a trend toward high performance and miniaturization is accelerated, for example, an imaging device such as digital still camera.

REFERENCE SIGNS LIST 10A, 10B: Optical filter, 1: resin substrate, 2, 2a, 2b: absorption layer, and 3a, 3b: dielectric multilayer film.

The invention claimed is:

1. An optical filter comprising:
a resin substrate having a thickness of 20 μm or more and 110 μm or less;
an absorption layer having a thickness of 0.25 μm or more and 12 μm or less and being disposed on at least one principal surface of the resin substrate; and
dielectric multilayer films disposed as an outermost layer on both principal surfaces of the resin substrate, wherein:
at least one of the dielectric multilayer films is a near-infrared reflection layer;
the resin substrate comprises, as a main component, a first transparent resin having a glass transition temperature of 170° C. or more, the first transparent resin having, when a thickness thereof is 100 μm, in a spectral transmittance curve over a wavelength range of 350 nm to 1,100 nm, an average internal transmittance in a wavelength range of 350 nm to 450 nm being 95% or more, a minimum internal transmittance in a wavelength range of 400 nm to 450 nm being 97% or more, and a wavelength at which an internal transmittance becomes 90% in a wavelength range of 500 nm or less being 350 nm or less;
the first transparent resin comprises at least one resin selected from a polyimide resin and a polycarbonate resin;
the absorption layer comprises a near-infrared absorbing dye (A) and a second transparent resin having a glass transition temperature of 170° C. or more, and the near-infrared absorbing dye (A) satisfies the following (ii-1) and (ii-2) in relation to the second transparent resin:
(ii-1) in a spectral transmittance curve over a wavelength range of 400 nm to 800 nm as measured in a state of the near-infrared absorbing dye (A) being contained in the second transparent resin, a maximum absorption wavelength $\lambda_{max(A)TR}$ is within a wavelength range of 680 nm to 745 nm; and
(ii-2) in a spectral transmittance curve over a wavelength range of 350 nm to 1,100 nm when the near-infrared dye (A) is incorporated into the second transparent resin and the internal transmittance at the maximum absorption wavelength $\lambda_{max(A)TR}$ is adjusted to 1%, both an average internal transmittance $T_{435\text{-}500ave(A)TR}$ for light in a wavelength range of 435 nm to 500 nm and an average internal transmittance $T_{500\text{-}600ave(A)TR}$ for light in a wavelength range of 500 nm to 600 nm are 94% or more;
the second transparent resin is a polyimide resin; and
an absolute value of a difference between an average transmittance of the optical filter in a range of 380 nm to 425 nm at an incident angle of 0° and an average transmittance of the optical filter in a range of 380 nm to 425 nm at an incident angle of 30° is 3% or less.

2. The optical filter according to claim 1, wherein the polycarbonate resin has a glass transition temperature of 200° C. or more, and the first transparent resin has, when the thickness thereof is 100 μm, in a spectral transmittance curve over a wavelength range of 350 nm to 1,100 nm, the average internal transmittance in a wavelength range of 350 nm to 450 nm being 98% or more, the minimum internal transmittance in a wavelength range of 400 nm to 450 nm being 98% or more, and the wavelength at which the internal transmittance becomes 90% in a wavelength range of 500 nm or less being 340 nm or less.

3. The optical filter according to claim 1, wherein the absorption layer has a thickness of 5 μm or less and contains from 5 to 20 parts by mass of the near-infrared absorbing dye per 100 parts by mass of the second transparent resin.

4. The optical filter according to claim 1, wherein the near-infrared absorbing dye (A) comprises a squarylium dye.

5. The optical filter according to claim 4, wherein the squarylium dye is a compound represented by the following formula (I) or (II):

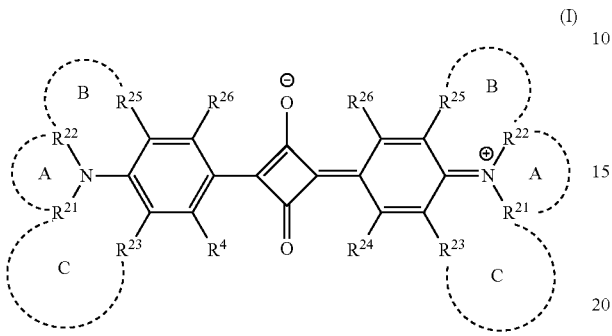

(I)

wherein symbols in formula (I) are as follows:
each of $R^{24}$ and $R^{26}$ independently represents a hydrogen atom, a halogen atom, a hydroxyl group, an alkyl or alkoxy group with a carbon number of 1 to 20, an acyloxy group with a carbon number of 1 to 10, an aryl group with a carbon number of 6 to 11, an alaryl group with a carbon number of 7 to 18 which may have a substituent and may have an oxygen atom between carbon atoms, —$NR^{27}R^{28}$ (wherein each of $R^{27}$ and $R^{28}$ independently represents a hydrogen atom, an alkyl group with a carbon number of 1 to 20, —C(=O)—$R^{29}$ (wherein $R^{29}$ is a hydrogen atom, a halogen atom, a hydroxyl group, or a hydrocarbon group with a carbon number of 1 to 25 which may have a substituent and may contain, between carbon atoms, an unsaturated bond, an oxygen atom or a saturated or unsaturated ring structure), —$NHR^{30}$, or —$SO_2$—$R^{30}$ (wherein each $R^{30}$ represents a hydrocarbon group with a carbon number of 1 to 25 in which one or more hydrogen atoms may be substituted by a halogen atom, a hydroxyl group, a carboxy group, a sulfo group or a cyano group and which may contain, between carbon atoms, an unsaturated bond, an oxygen atom or a saturated or unsaturated ring structure)), or a group represented by the following formula(S) (wherein $R^{41}$ and $R^{42}$ independently represent a hydrogen atom, a halogen atom, or an alkyl or alkoxy group with a carbon number of 1 to 10, and k is 2 or 3):

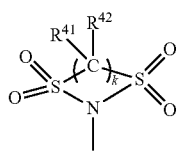

(S)

$R^{21}$ and $R^{22}$, $R^{22}$ and $R^{25}$, and $R^{21}$ and $R^{23}$ may combine with each other to form, respectively, a heterocyclic ring A, a heterocyclic ring B, and a heterocyclic ring C, together with a nitrogen atom, each ring having 5 or 6 ring members;
$R^{21}$ and $R^{22}$, when forming heterocyclic ring A, represent, as a divalent group —Q— formed by bonding $R^{21}$ and $R^{22}$, an alkylene or alkyleneoxy group in which a hydrogen atom may be substituted by an alkyl group with a carbon number of 1 to 6, an aryl group with a carbon number of 6 to 10, or an acyloxy group with a carbon number of 1 to 10 which may have a substituent;
$R^{22}$ and $R^{25}$, when forming heterocyclic ring B, and $R^{21}$ and $R^{23}$, when forming heterocyclic ring C, represent, as divalent groups —$X^1$-$Y^1$— and —$X^2$-$Y^2$— (in which a side bonded to nitrogen is $X^1$ and $X^2$) formed by bonding $R^{22}$ and $R^{25}$, and $R^{21}$ and $R^{23}$, respectively, groups in which each of $X^1$ and $X^2$ is a group represented by the following formula (1x) or (2x) and each of $Y^1$ and $Y^2$ is a group represented by any one selected from the following formulae (1y) to (5y), in a case where each of $X^1$ and $X^2$ is a group represented by the following formula (2x), each of $Y^1$ and $Y^2$ may be a single bond, and in this case, the group may have an oxygen atom between carbon atoms:

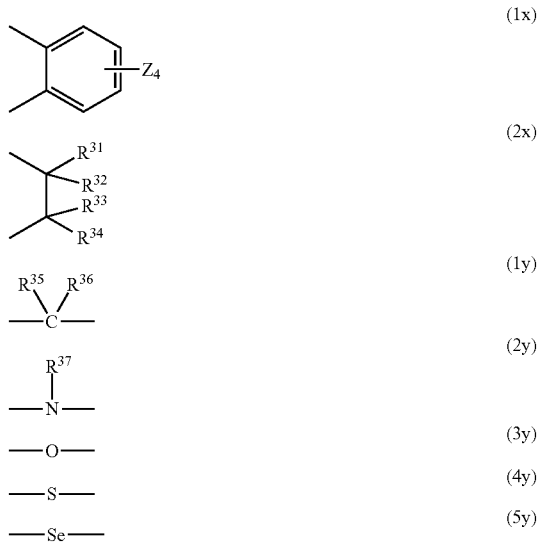

each of four Z in formula (1x) independently represents a hydrogen atom, a hydroxyl group, an alkyl or alkoxy group with a carbon number of 1 to 6, or —$NR^{38}R^{39}$ (wherein each of $R^{38}$ and $R^{39}$ independently represents a hydrogen atom or an alkyl group with a carbon number of 1 to 20), each of $R^{31}$ to $R^{36}$ independently represents a hydrogen atom, an alkyl group with a carbon number of 1 to 6, or an aryl group with a carbon number of 6 to 10, and $R^{37}$ represents an alkyl group with a carbon number of 1 to 6 or an aryl group with a carbon number of 6 to 10;
$R^{27}$, $R^{28}$, $R^{29}$, $R^{31}$ to $R^{37}$, $R^{21}$ to $R^{23}$ when not forming a heterocyclic ring, and $R^{25}$ may combine with any other member among these to form a 5-or 6-membered ring, and $R^{31}$ and $R^{36}$, and $R^{31}$ and $R^{37}$ may be bonded directly;
each of $R^{21}$, $R^{22}$, $R^{23}$ and $R^{25}$ when not forming a heterocyclic ring independently represents a hydrogen atom, a halogen atom, a hydroxyl group, an alkyl or alkoxy group with a carbon number of 1 to 20, an acyloxy group with a carbon number of 1 to 10, an aryl with a carbon number of 6 to 11, or an alaryl group with a carbon number of 7 to 18 which may have a substituent and may have an oxygen atom between carbon atoms, (II)

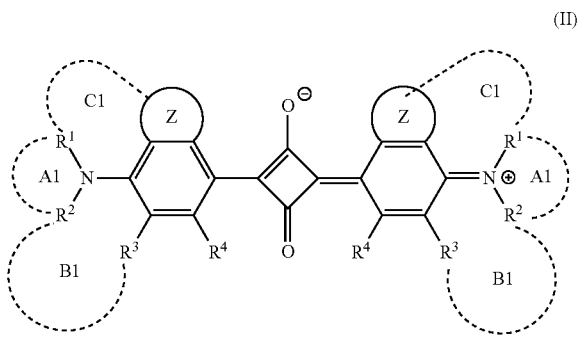

wherein symbols in formula (II) are as follows:
each of rings Z is independently a 5-or 6-membered ring having from 0 to 3 heteroatoms in the ring, and a hydrogen atom contained in ring Z may be substituted; $R^1$ and $R^2$, $R^2$ and $R^3$, and $R^1$ and a carbon atom or heteroatom constituting ring Z may combine with each other to form, respectively, a heterocyclic ring A1, a heterocyclic ring B1, and a heterocyclic ring C1, together with a nitrogen atom, and in this case, a hydrogen atom contained in the heterocyclic ring A1, heterocyclic ring B1 and heterocyclic ring C1 may be substituted; each of $R^1$ and $R^2$ when not forming a heterocyclic ring independently represents a hydrogen atom, a halogen atom, or a hydrocarbon group which may contain, between carbon atoms, an unsaturated bond, a heteroatom, or a saturated or unsaturated ring structure and may have a substituent; and each of $R^4$ and $R^3$ when not forming a heterocyclic ring independently represents a hydrogen atom, a halogen atom, or an alkyl or alkoxy group which may contain a heteroatom between carbon atoms and may have a substituent.

6. The optical filter according to claim 1, wherein the optical filter has the absorption layer on both principal surfaces of the resin substrate, and both absorption layers have a thickness of 1.5 μm or less.

7. The optical filter according to claim 1, wherein an absorption layer -attached resin substrate obtained by disposing the absorption layer on at least one principal surface of the resin substrate has, in a spectral transmittance curve over a wavelength range of 350 nm to 1,100 nm, an average internal transmittance in a wavelength range of 435 nm to 480 nm being 90.5% or more, an average internal transmittance in a wavelength range of 500 nm to 600 nm being 90.5% or more, a wavelength at which an internal transmittance becomes 20% in a wavelength range of 600 nm to 740 nm being within a wavelength range of 650 nm to 685 nm, and an average internal transmittance in a wavelength range of 700 nm to 730 nm being 3% or less.

8. The optical filter according to claim 1, wherein the absorption layer further comprises an ultraviolet absorbing dye (U) having, in a spectral transmittance curve over a wavelength range of 350 nm to 1,100 nm as measured in a state of being dissolved in dichloromethane, a maximum absorption wavelength $\lambda_{max(U)DCM}$ being within a wavelength range of 380 nm to 420 nm.

9. The optical filter according to claim 8, wherein the ultraviolet absorbing dye (U) comprises a merocyanine dye.

10. The optical filter according to claim 1, satisfying the following requirements:
(I-1) at an incident angle of 0°, an average transmittance of light in a wavelength range of 435 nm to 480 nm is 86% or more and an average transmittance of light in a wavelength range of 500 nm to 600 nm is 89% or more;
(I-2) at an incident angle of 30°, an average transmittance of light in a wavelength range of 435 nm to 480 nm is 85% or more and an average transmittance of light in a wavelength range of 500 nm to 600 nm is 89% or more;
(I-4) an absolute value of a difference between an average transmittance in a range of 615 nm to 725 nm at an incident angle of 0° and an average transmittance in a range of 615 nm to 725 nm at an incident angle of 30° is 3% or less; and
(I-5) in a transmittance of light at an incident angle of 0°, a wavelength at which the transmittance becomes 20% is present in a wavelength range of 650 nm to 685 nm.

11. An imaging device comprising the optical filter according to claim 1.

12. The optical filter according to claim 1, wherein the first transparent resin comprises a polyimide resin.

* * * * *